US012768914B2

(12) United States Patent
Sui et al.

(10) Patent No.: US 12,768,914 B2
(45) Date of Patent: Oct. 20, 2026

(54) HALL SENSOR WITH COMPLEMENTARY COIL SYSTEM

(71) Applicant: Texas Instruments Incorporated, Dallas, TX (US)

(72) Inventors: Fanping Sui, Plano, TX (US); Chao-Hsiuan Tsay, Tucson, AZ (US); Dok Won Lee, Mountain View, TX (US); Chase Mackenzie Puglisi, Tucson, AZ (US); Dimitar Trifonov, Vail, AZ (US); Wai Lee, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 175 days.

(21) Appl. No.: 18/677,885

(22) Filed: May 30, 2024

(65) Prior Publication Data

US 2025/0370072 A1 Dec. 4, 2025

(51) Int. Cl.
*G01R 33/07* (2006.01)
*G01R 33/00* (2006.01)

(52) U.S. Cl.
CPC ......... *G01R 33/07* (2013.01); *G01R 33/0005* (2013.01); *G01R 33/0011* (2013.01); *G01R 33/0047* (2013.01); *G01R 33/0094* (2013.01)

(58) Field of Classification Search
CPC .................................................... G01R 31/396
See application file for complete search history.

(56) References Cited

U.S. PATENT DOCUMENTS 4,692,703 A * 9/1987 Extance ................ H10N 52/80 324/254
2010/0117638 A1* 5/2010 Yamashita ......... G01R 33/0206 324/233
2021/0025948 A1* 1/2021 Bito .................. G01R 33/0011

* cited by examiner

*Primary Examiner* — Tung X Nguyen
(74) *Attorney, Agent, or Firm* — Xianghui Huang; Charles F. Koch

(57) ABSTRACT

In described examples, an integrated circuit (IC) written on a substrate that includes a substrate surface includes a magnetic concentrator, a Hall sensor, a primary coil, and a secondary coil. The Hall sensor at least partially overlaps the magnetic concentrator. The primary coil at least partially overlaps the magnetic concentrator. The secondary coil at least partially overlaps the magnetic concentrator and the primary coil, and surrounds the Hall sensor.

20 Claims, 18 Drawing Sheets

HALL SENSOR WITH COMPLEMENTARY COIL SYSTEM

TECHNICAL FIELD

This application relates generally to magnetic field sensors, and more particularly to Hall sensors with magnetic concentrators.

BACKGROUND

Hall effect sensors use a voltage caused by a Lorentz force exerted by a magnetic field (or B-field) on electrons in a current flowing through a conductor to detect and measure a component of the magnetic field that is perpendicular to the current flow. Hall effect sensors can provide benefits including some or all of low cost and/or relatively small device footprint. This enables Hall effect sensors to be used in a wide variety of industrial and consumer applications, such as rotation angular speed sensing, position sensing, fluid flow sensing, current sensing, and pressure sensing.

SUMMARY

In described examples, an integrated circuit (IC) written on a substrate that includes a substrate surface includes a magnetic concentrator, a Hall sensor, a primary coil, and a secondary coil. The Hall sensor at least partially overlaps the magnetic concentrator. The primary coil at least partially overlaps the magnetic concentrator. The secondary coil at least partially overlaps the magnetic concentrator and the primary coil, and surrounds the Hall sensor.

DETAILED DESCRIPTION

Figure 1:
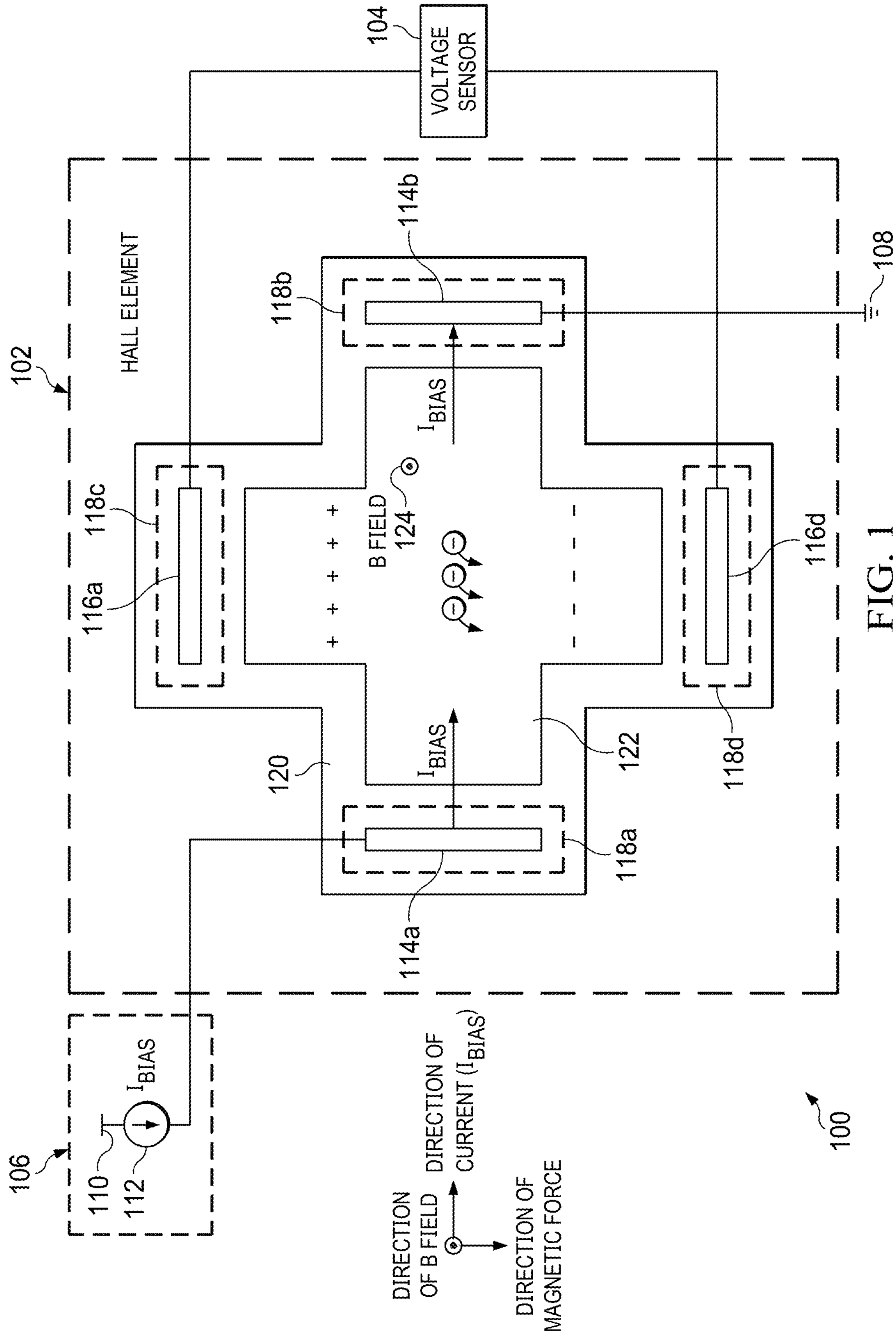
FIG. 1 is a top view of an example Hall effect sensor, including a Hall element fabricated on a substrate such as a semiconductor wafer.

A Hall effect sensor senses a magnetic field that is oriented in a direction perpendicular to the surface of a substrate (or other workpiece) by sensing a voltage parallel to the surface of the substrate. Herein, up refers to a direction perpendicular to a substrate surface, from a substrate body towards the substrate surface. Down refers to a direction perpendicular to the substrate surface, from the substrate surface to the substrate body. Vertical refers to the dimension described by the up and down directions. Horizontal refers to the dimension perpendicular to the vertical dimension, accordingly, parallel to the substrate surface.

If a current flows through a conductor parallel to the surface of the substrate, and a magnetic field (or component of a magnetic field) is oriented perpendicular to the surface of the substrate and perpendicular to the direction of current flow, then the magnetic field will push electrons in the current flow. The direction of this push is parallel to the surface of the substrate and perpendicular to the direction of current flow, with an orientation determined by whether the direction of the magnetic field is into or out of the surface of the substrate. The push displaces the electrons in the current flow in the direction of the push, generating a voltage in a direction parallel to the substrate surface. The Hall effect sensor senses this voltage. An example Hall effect sensor is described with respect to FIG. 1.

A magnetic concentrator (or magnetic flux concentrator) is a structure that focuses magnetic flux lines and emanates the concentrated magnetic field from a surface of the magnetic concentrator as a fringe effect field. A magnetic concentrator is made of a soft magnetic material, such as a material with high permeability, and low remanence. For example, Ni—Fe alloy, Ni, Fe, Co, and their binary and ternary alloys can be used to form a magnetic concentrator. Magnetic concentrators are further described with respect to FIG. 2.

Hall effect sensors are used in applications such as motor control, load detection, and power management with kilovolt switching (kV). In some examples, these kV signals have current levels from tenths of Amperes to hundreds of Amperes. High voltage signals, even with relatively low current levels, can degrade or destroy integrated circuits fabricated on semiconductors. The strength of a magnetic field induced by a current through a conductor is proportional to the current through the conductor. Accordingly, Hall effect sensors can be used as in-package or ambient current sensors to determine current and/or voltage levels of high voltage signals without passing those signals through sensitive on-chip circuits.

A magnetic field-sensitive portion of a Hall effect sensor is referred to herein as a Hall element. In some examples, high power signals generate magnetic fields that can be described as uniform magnetic fields: uniform in direction and in strength across a substrate region that includes Hall effect sensor elements (Hall elements). In some examples, these externally generated magnetic fields are uniform in response to distance from or size of the magnetic field source. For example, some high power signals generate magnetic fields that vary in direction and strength across a volume. In some examples, there is a relative large difference, such as an order-of-magnitude difference, between a distance between a high power signal and a die that includes a Hall element, and a size of the die. In such examples, the magnetic field applied to the Hall element by the high power signal can be approximated, and accordingly described, as uniform in direction and strength.

Herein, Hall element response refers to an output signal of the Hall element indicating a strength of a magnetic field sensed by the Hall element. In some examples, testing and calibration (trimming) of Hall effect sensors to determine correlation of Hall effect sensor response to varying magnetic fields is performed using on-chip coils with a magnetic flux concentrator (magnetic concentrator). The on-chip coils are used to generate a magnetic field designed to emulate an externally generated uniform magnetic field where the on-chip-generated magnetic field (coil field) intersects the Hall elements.

The on-chip coils, the magnetic concentrator, and the Hall elements may each experience manufacturing variations, also called process variations, in various size and relative position parameters. Process variations may have respective, various, first proportional contributive effects on Hall element response to the coil field, and respective, various, second proportional contributive effects on Hall element response to the uniform field. Expressed differently: process variations may affect Hall element response to the coil field one way, and may affect Hall element response to the uniform field in a different way. A ratio between a proportional contributive effect of a parameter on Hall element response to the coil field, and a corresponding proportional contributive effect of the same parameter on Hall element response to the uniform field, is referred to herein as a correlation coefficient.

Some example process variations that affect Hall element response include coil dimension changes, Hall element dimension changes, magnetic concentrator dimension changes, changes in spacing between Hall elements and coils, and changes in spacing between a magnetic concentrator and coils.

Herein, process variation refers to manufacturing process-related deviation from designed dimensions and relative positions of the Hall elements, on-chip coils, and magnetic concentrator. These deviations can alter dimensions or relative positions horizontally, accordingly in an X dimension or a Y dimension, or vertically, accordingly in a Z dimension.

Process-related deviations in an X dimension or a Y dimension are also referred to herein as misalignment. Note that misalignment is used herein to refer generally to displacement of components from designed relative locations, and does not necessarily indicate a cause of such displacement. In some examples, Hall elements, on-chip coils, and magnetic concentrators are fabricated in a same process, but on different layers. In some examples, imprecision in layer-to-layer alignment or assembly-(integration-) related misalignment contributes to misalignment-related process variation.

Process variation of components can alter how much the strength of a magnetic field detected by Hall elements changes responsive to the coil field and/or the uniform field. Accordingly, process variation of components affects corresponding correlation coefficients. A correlation coefficient may be expressed as a ratio between (a) a change in Hall element response to a particular magnetic field strength emitted by a coil, and (b) a change in Hall element response to the particular magnetic field strength emitted by a uniform field source. This ratio may be expressed in the form (a):(b).

For example, assume that the variables A and B represent arbitrary Hall element response level percentage changes. In a particular example, misalignment of a magnetic concentrator with respect to a Hall element in a first direction (such as an X direction) may have a 5:1 correlation coefficient. Accordingly, in the example, a misalignment of 0.1 micrometers (μm) will contribute a change of 5×A in Hall element response level responsive to a coil field, and will contribute a change in Hall element response level of A responsive to a uniform field. Similarly, misalignment of a magnetic concentrator with respect to a Hall element in a second direction (such as a Y direction) may have a 50:1 correlation coefficient. In an example, this means that a misalignment of 0.1 μm will contribute a change of 50×B in Hall element response to a coil field, and will contribute a change in Hall element response of B to a uniform field.

Package stress and process variation in the Hall element itself can cause Hall element response to vary from designed levels. If correlation coefficients are not 1:1, it can be difficult or impossible post-manufacturing to disentangle different, cumulative sources of deviation from design of Hall element response. In particular, it can be difficult to separate response deviation due to package stress or process variation of the Hall element from response deviation due to process variation in other components. This can reduce fidelity of testing and trimming processes applied to the Hall effect sensor system.

If a correlation coefficient is 1:1, then process variations for a corresponding component distort a Hall element response curve for variable coil field strength in a same proportion that the process variations for the corresponding component distort a Hall element response curve for variable field strength of a uniform field source.

A multiple coil design can be used to set correlation coefficients to equal (or approximate) 1:1. In some examples, benefits of an on-chip multiple coil system with correlation coefficients equal to 1:1 include one or more of enabling highly accurate Hall element response to a uniform magnetic field by trimming Hall element response to a coil field, and enabling robust accuracy across process variation of a trimmed Hall effect sensor system. An example multiple coil design is described with respect to FIG. 4.

The multiple coil design includes a relatively larger primary coil with a first set of correlation coefficients of the form A: 1, and one or more smaller secondary coils with a second set of correlation coefficients of the form B: 1. Size and relative location parameters are selected so that A is the same (or can be treated as the same) for each component correlation coefficient and B is the same (or can be treated as the same) for each component correlation coefficient. Accordingly, the correlation coefficients of the entire system can be expressed as shown in Equation 1, where x represents the magnitude of a magnetic field generated by a primary coil and y represents the magnitude of a magnetic field generated by one or more secondary coils.

$$\frac{Ax+By}{x+y}:1 \qquad \text{Equation 1}$$

In some examples, an ideal coil system has a correlation coefficient of 1:1. The variable x in Equation 1 can be tuned by changing a current applied to the primary coil. The variable y in Equation 1 can be tuned by changing a current applied to the secondary coil(s). The variables A and B in Equation 1 can be adjusted by design of a Hall effect sensor system. For example, current levels can be set so that x=y=1, and a Hall effect sensor system can be designed so that B=2−A. This enables improved accuracy of Hall element calibration and, consequently, improved accuracy of magnetic field strength measurement.

Figure 4:
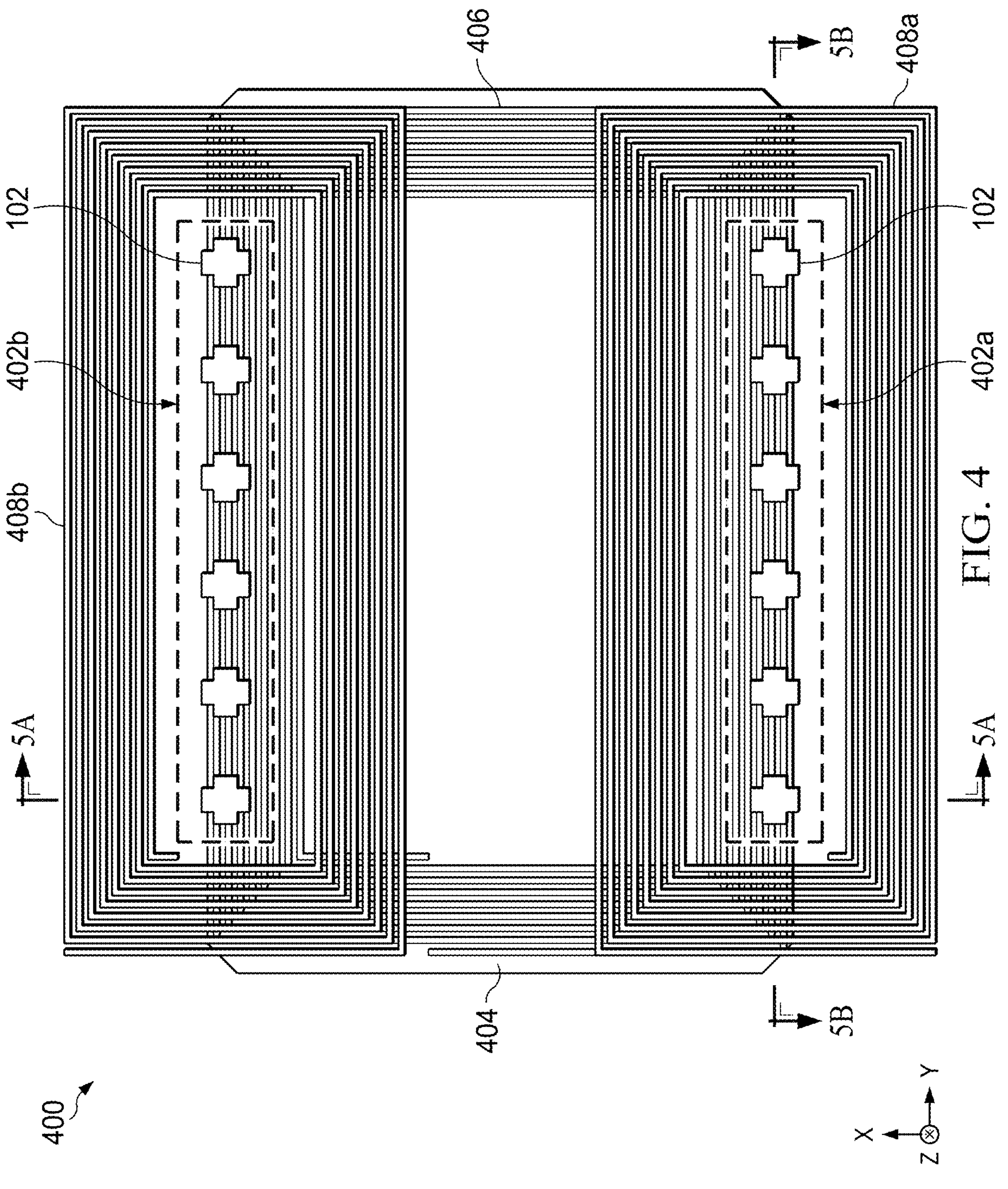
FIG. 4 is a bottom-up view of a fourth example Hall effect sensor system including linear arrays of Hall elements, a magnetic concentrator, a primary coil, and secondary coils.

An example tunable Hall effect sensor system is described with respect to FIG. 4. Selection of certain size and relative position parameters of the coils, the magnetic concentrator, and the Hall elements to perform such tuning is described with respect to FIGS. 5A through 8.

Herein, some structures that are distinct but related have reference numbers that use a [number] [letter] format, such as bias contacts 114*a* and 114*b* and sense contacts 116*a* and 116*b*. In some examples, these structures or signals are referred to generally, in the singular or as a group, using the [number] and without the [letter], such as bias contacts 114 and sense contacts 116. Also, the same reference numbers or other reference designators are used in the drawings to designate features that are related structurally and/or functionally.

FIG. 1 is a top view of an example Hall effect sensor 100, including a Hall element 102 fabricated on a substrate such as a semiconductor wafer. The Hall effect sensor 100 includes a voltage sensor 104, a bias circuit 106, and a ground 108. The bias circuit 106 includes a voltage source 110 and a current source 112 providing a bias current $I_{BIAS}$. In some examples, the substrate includes, and the Hall element 102 is part of, an integrated circuit (IC). In some examples, the IC is part of an IC package that includes and connects the IC to external connectors (connectors to circuits outside the IC package) such as pins, balls, leads, or wires.

The Hall element 102 includes a first bias contact 114*a*, a second bias contact 114*b*, a first sense contact 116*a*, a second sense contact 116*b*, a first N+ doped region 118*a*, a second N+ doped region 118*b*, a third N+ doped region 118*c*, a fourth N+ doped region 118*d*, an N-type well 120, and a P+ doped layer 122. The bias contacts 114 and the sense contacts 116 are P+ doped regions. Additional, different, and/or fewer layers and/or components can be used to fabricate a Hall effect sensor such as the Hall effect sensor 100.

Herein, a first component surrounding a second component means that, in a two-dimensional view of the substrate taken in a direction perpendicular to the substrate surface, the first component encircles the second component. The first bias contact 114*a* is surrounded by the first N+ doped region 118*a*. The second bias contact 114*b* is surrounded by the second N+ doped region 118*b*. The first sense contact 116*a* is surrounded by the third N+ doped region 118*c*. The second sense contact 116*b* is surrounded by the fourth N+ doped region 118*d*. The P+ doped layer 122 has a cross shape. The first bias contact 114*a* is located at a first end (as illustrated, a left end) and the second bias contact 114*b* is located at a second end (as illustrated, a right end) of a first arm of the cross-shaped P+ doped layer 122. The first sense contact 116*a* is located at a first end (as illustrated, a top end) and the second sense contact 116*b* is located at a second end (as illustrated, a bottom end) of a second arm of the cross-shaped P+ doped layer 122. The bias contacts 114, the sense contacts 116, the N+ doped regions 118, and the P+ doped layer 122 are respectively surrounded by the N-type well 120.

The voltage source 110 is connected to a first terminal of the current source 112. A second terminal of the current source 112 is connected to the first bias contact 114*a*. The second bias contact 114*b* is connected to ground 108. The first sense contact 116*a* is connected to a first terminal of the voltage sensor 104, and the second sense contact 116*b* is connected to a second terminal of the voltage sensor 104. In some examples, there are metal lines, vias, and/or pads included in these respective connections to the bias contacts 114 and the sense contacts 116.

Fleming's left hand rule is useful to describe function of a Hall effect sensor such as the Hall effect sensor 100. Fleming's left hand rule applies when a current-carrying conductor is located inside a magnetic field so that a magnetic force acts on the electrons in the conductor in a direction perpendicular to both the directions of the current and of the magnetic field. (A magnetic field that is not perpendicular to the current can be divided into components parallel and perpendicular to the current to make this determination.) In this case, point the left forefinger straight, extend the left thumb perpendicular to the left forefinger, and make the left middle finger perpendicular to the palm. The middle finger points in the direction of the current, the forefinger points in the direction of the magnetic field, and the thumb points in the direction of a magnetic force exerted by the magnetic field on the conductor, and accordingly, on the electrons travelling through the conductor.

In the Hall effect sensor 100, IBIAS is applied at the first bias contact 114*a* and flows left to right through the P+ doped layer 122 to the second bias contact 114*b*. If a magnetic field (B field) 124 is applied out of the board (forefinger towards the viewer), as indicated by the dot within a circle, then because current is flowing left to right parallel to the surface of the substrate (middle finger pointing rightward), a magnetic force is exerted in the direction of the body of the substrate 104 (thumb towards the bottom of the page). This magnetic force pushes electrons within the current (indicated by circled minus signs) towards the second sense contact 116*b*, so that there is a charge gradient, and accordingly an electric field, between the first sense contact 116*a* and the second sense contact 116*b*. The electric field corresponds to a Hall voltage. An illustration of this example application of the left hand rule is provided below the Hall element 102.

The production of this Hall voltage in response to applying a B field (a magnetic field, such as the B field 124) to a current-carrying conductor (such as the p+ doped layer 122) is referred to as the Hall effect. Accordingly, for a current that is parallel to the surface of a substrate and a magnetic field that is perpendicular to the substrate surface and to the current, a voltage is generated parallel to the substrate surface and perpendicular to both the current and the magnetic field.

Figure 2A:
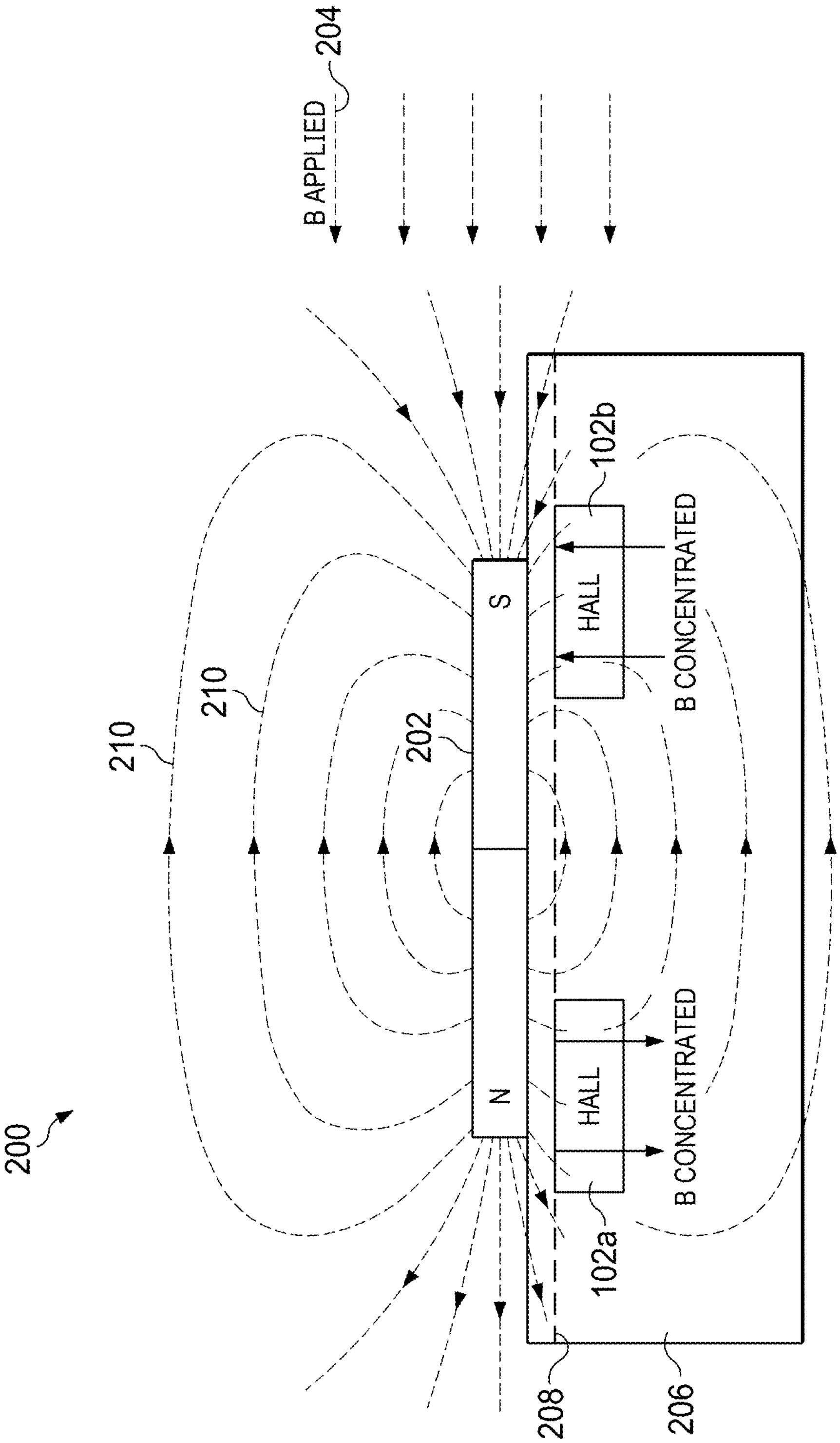
FIG. 2A is a side view of a first example Hall effect sensor system including Hall elements and a magnetic concentrator with an externally applied magnetic field.

FIG. 2A is a side view of a first example Hall effect sensor system 200 including Hall elements 102 and a magnetic concentrator 202 with an externally applied magnetic field (B applied) 204. The Hall elements 102 and the magnetic concentrator 202 are fabricated on a substrate 206. The externally applied magnetic field 204 is oriented parallel to the substrate surface 208. The externally applied magnetic field 204 induces a magnetic field within the magnetic concentrator 202, which is emitted as a fringe field with magnetic field lines 210. In some examples, the magnetic concentrator 202 can be described as having a north pole (N) and a south pole(S) with respect to the emitted fringe field. The magnetic concentrator 202 emits the fringe field with some signal gain with respect to the externally applied magnetic field 204.

A first Hall element 102*a* is located under the north pole of the magnetic concentrator 202 so that the magnetic field lines 210 intersect the first Hall element 102*a* in a direction approximately perpendicular to the substrate surface 208 and oriented into the body of the substrate 206. A second Hall element 102*b* is located under the south pole of the magnetic concentrator 202 so that the magnetic field lines 210 intersect the second Hall element 102*b* in a direction approximately perpendicular to the substrate surface 208 and oriented towards the substrate surface 208. Herein, approximately perpendicular refers to a direction, such as a designed direction or direction range, sufficiently perpendicular to the Hall element 102 to reach a designed response curve and/or a designed level or range of sensitivity.

The gain provided by the magnetic concentrator 202 enables improved performance of the Hall elements 102, corresponding to reduced noise and increased signal-to-noise ratio (SNR) of the Hall effect sensor 100 output with respect to a magnetic field generated by a field source. In some examples, a field source corresponds to one or more on-chip coils or a uniform field source. The fringe field emitted by the magnetic concentrator 202 is also reoriented to be perpendicular both to the direction of current flow (between the bias contacts 114) and the direction of voltage sensing (between the sense contacts 116), enabling the Hall effect sensor 100 to sense an externally applied magnetic field 204 that is parallel (rather than perpendicular) to the substrate surface 208. Accordingly, the magnetic concentrator 202 provides benefits that may include one or more of improved sensitivity and simplified design of a Hall effect sensor 100.

Figure 2B:
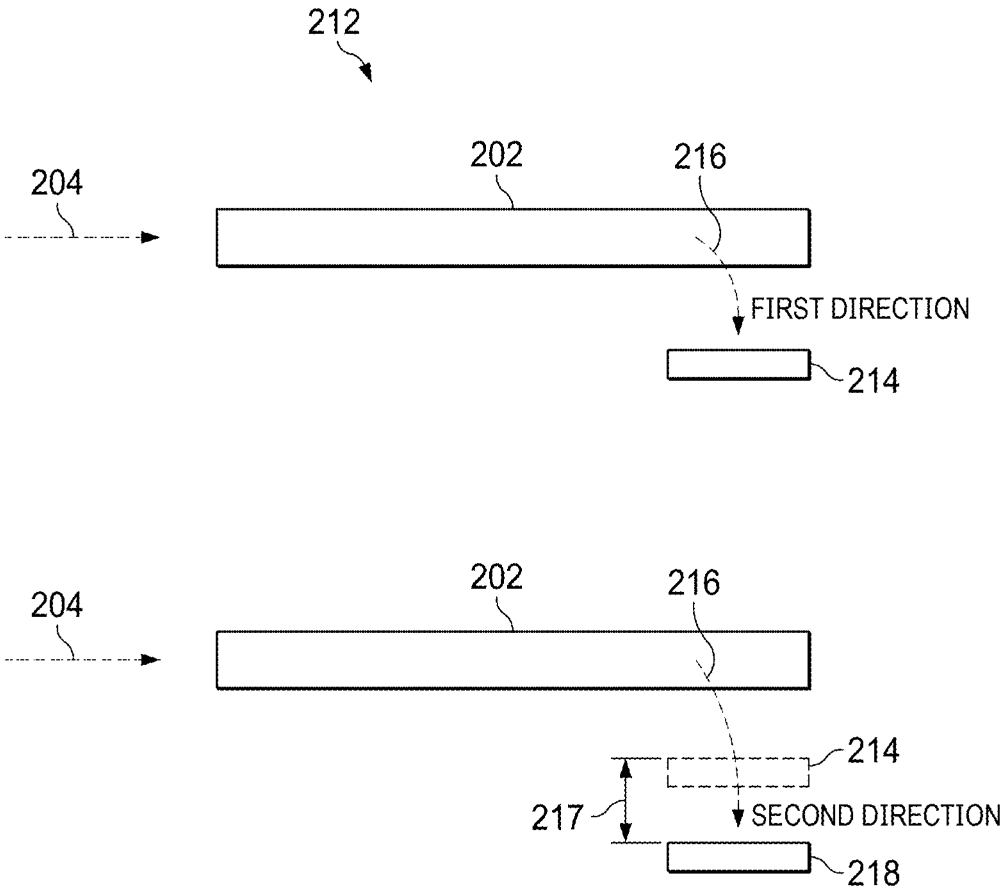
FIG. 2B is a second example Hall effect sensor system including a Hall element and a magnetic concentrator with an eternally applied uniform magnetic field.

FIG. 2B is a second example Hall effect sensor system 212 including a Hall element 102 and a magnetic concentrator 202 with an externally applied uniform magnetic field 204. Above, the Hall element 102 is shown as located in its designed position, accordingly, there is no process variation in the position of the Hall element 102. The designed position of the Hall element 102 is indicated as Hall element 214. As described with respect to FIG. 2A, the uniform magnetic field 204 causes the magnetic concentrator 202 to emit a magnetic field 216. The magnetic field 216 has a first direction where it intersects the Hall element 214.

Below, the Hall element 102 is shown as located in a position displaced by a distance 217 in a Z dimension, accordingly in a direction perpendicular to a substrate surface (see FIG. 2D), with respect to the Hall element 214 in its designed position. The position of the Hall element 102 displaced due to this process variation is indicated as Hall element 218. For comparison, Hall element 214 is shown with a dotted outline. The magnetic field 216 has a second, different direction where it intersects the Hall element 218 because magnetic field lines are curved and the Hall element 218 is a different distance from the magnetic concentrator 202 than the Hall element 214.

Figure 2C:
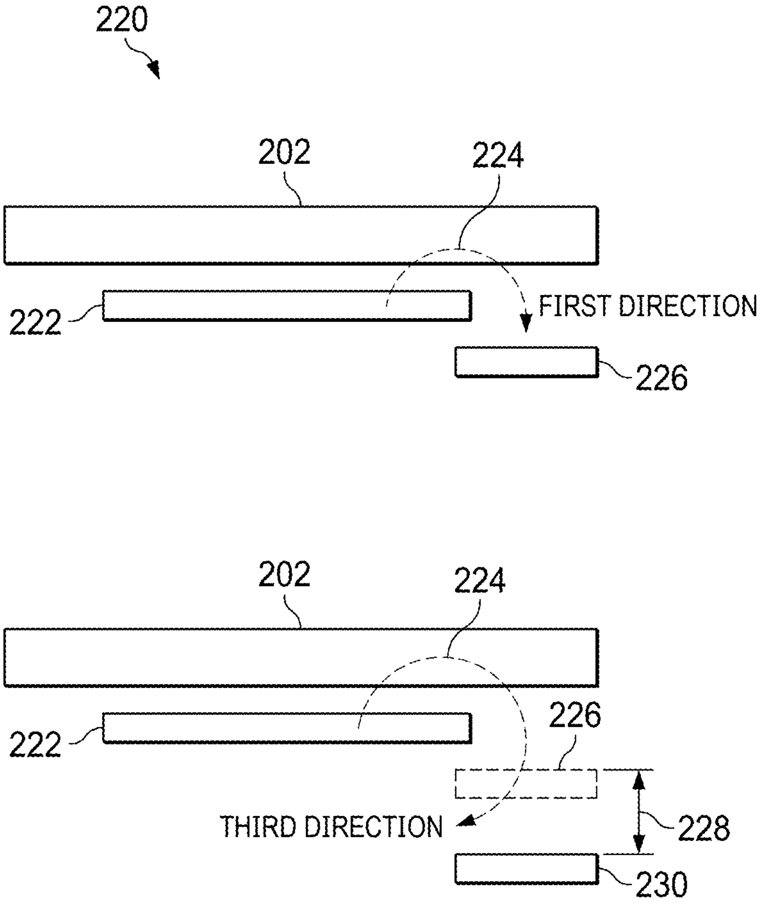
FIG. 2C is a third example Hall effect sensor system including a Hall element and an on-chip coil.

FIG. 2C is a third example Hall effect sensor system 220 including a Hall element 102 and an on-chip coil 222.

When there is a current through the on-chip coil 222 it generates a magnetic field. This on-chip coil 222 field causes the magnetic concentrator 202 to generate a magnetic field, similar to the uniform field example of FIGS. 2A and 2B. The magnetic field line 224 is intended to describe this field-inducement process, as well as a summed effect at the Hall element 214 of the on-chip coil 222 field and the magnetic concentrator 202 field. In the illustrated example, the Hall effect sensor system 220 is designed so that the magnetic field line 224 has the first direction (the same direction as in the "above" example of FIG. 2B) where it intersects the Hall element 102.

Accordingly, above, the Hall element 102 is located in a designed position (no process variation), and in that position is referred to as Hall element 226. Below, the Hall element 102 is displaced in the Z dimension by a distance 228 (a process variation), and in that displaced position is referred to as Hall element 230. The Hall element 226 is shown with the Hall element 230, as a dotted outline, for comparison. The magnetic field line 224 has a third direction, different from the first direction and the second direction, where it intersects the Hall element 230.

The second direction is responsive to process variation in the Z dimension position of the Hall element 214 relative to the magnetic concentrator 202 in the uniform magnetic field 204 example described with respect to the Hall effect sensor system 212 of FIG. 2B. The third direction is responsive to process variation in the Z dimension position of the Hall element 226 relative to the magnetic concentrator 202 in the on-chip coil 222 field example described with respect to the Hall effect sensor system 220 of FIG. 2C. The difference between the second direction and the third direction is responsive to the different shape of the summed fields generated by the magnetic concentrator 202 and the on-chip coil 222, corresponding to the magnetic field line 224, as compared to the magnetic field 216 generated by the magnetic concentrator 202 alone.

Figure 2D:
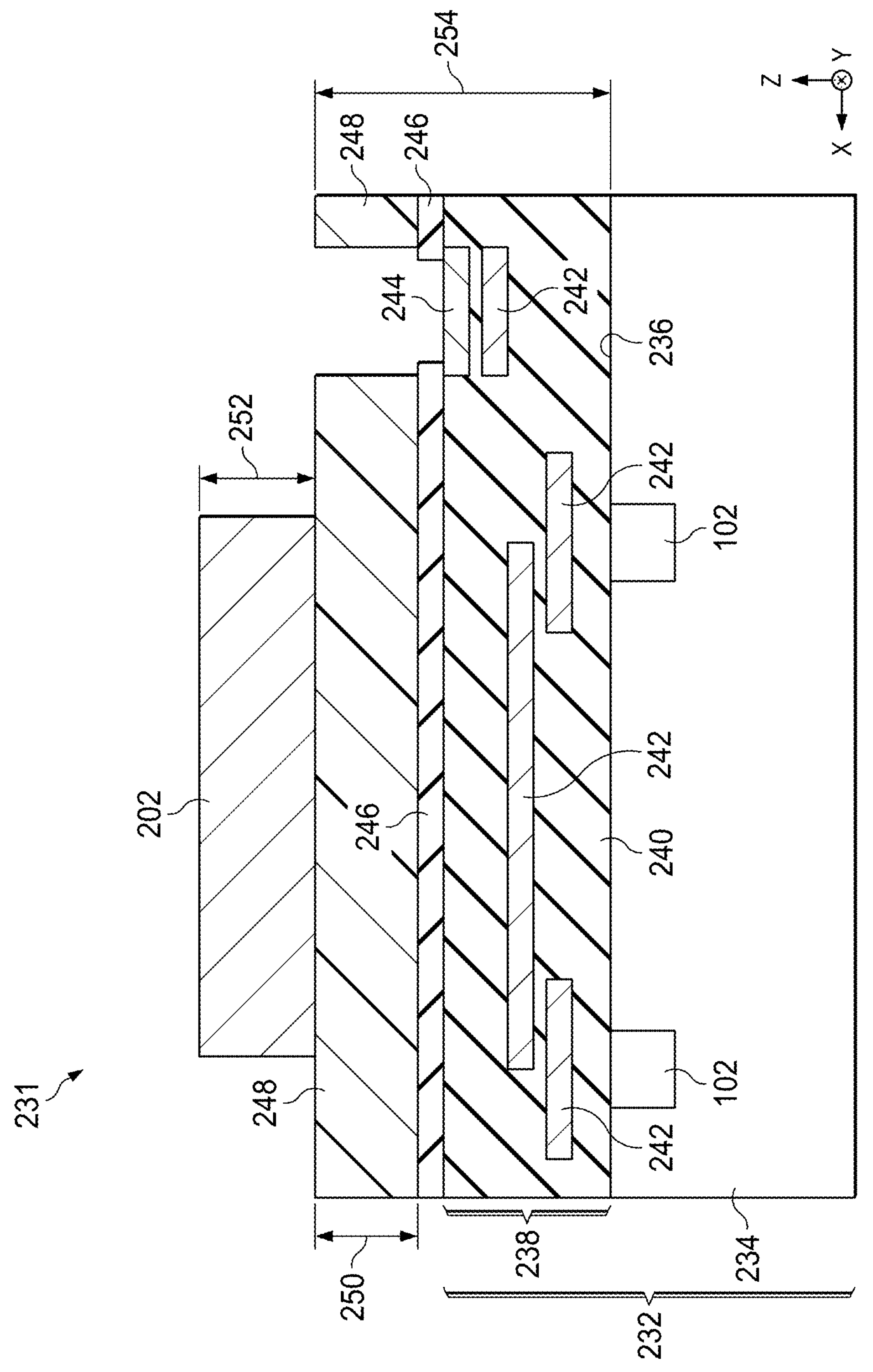
FIG. 2D is a cross-sectional view of the Hall effect sensor system of FIG. 2A.

FIG. 2D is a cross-sectional view 232 of the Hall effect sensor system 200 of FIG. 2A. The sensor system 200 is fabricated as or as part of an integrated circuit on a semiconductor die 232 that includes a semiconductor substrate 234 with a substrate surface 236. The semiconductor substrate 234 includes two Hall elements 102. While an example Hall element is described above, other types or configurations of Hall element 102 may be implemented.

The semiconductor substrate 234 may be or include a bulk semiconductor substrate, a semiconductor-on-insulator (SOI) substrate, or other semiconductor substrate. In some examples, the semiconductor substrate 234 includes one or more epitaxial layers epitaxially grown on an underlying substrate. In some examples, the semiconductor substrate 234 is or includes a bulk silicon substrate, such as a bulk silicon substrate singulated from a wafer. In some examples, a bulk silicon substrate includes one or more silicon epitaxial layers epitaxially grown on the bulk silicon substrate.

The semiconductor die 232 further includes an interconnect structure 238 on or over the substrate surface 236. The interconnect structure 238 includes one or more dielectric layers 240 and one or more interconnect metal layers 242 embedded in or surrounded by the dielectric layer(s) 240. On-chip coils, such as a primary coil 406 (FIG. 4) and/or one or more secondary coils 408, are fabricated in respective interconnect metal layers 242.

The one or more dielectric layers 240 may include a pre-metal dielectric (PMD) layer, one or more inter-metal dielectric (IMD) layers, one or more etch stop layers (ESLs), the like, or a combination thereof. Each dielectric layer 240 may be or include any dielectric to provide electrical insulation or reduced electrical conductivity, such as silicon oxide, borophosphosilicate glass (BPSG), phosphosilicate glass (PSG), silicon nitride, silicon oxynitride, silicon oxycarbon nitride, silicon oxycarbide, or the like.

Each interconnect metal layer 242 may include metal contacts, metal vias, and/or metal lines. The top-most interconnect metal layer 242 of the interconnect structure 238 includes a metal external connector bond pad 244. The metal external connector bond pad 244 of the top-most interconnect metal layer 242 may be configured to have attached thereto an external connector, such as a wire by wire bonding.

Each interconnect metal layer 242 may include one or more barrier and/or adhesion layers and a fill metal on the one or more barrier and/or adhesion layers. In some examples, an interconnect metal layer 242 includes one or more metal contacts, metal vias, metal lines, and/or metal bond pads therein. In some examples, a barrier and/or adhesion layer includes one or more of titanium nitride (TiN), tantalum nitride (TaN), the like, or a combination thereof. In some examples, a fill metal includes one or more of tungsten (W), copper (Cu), aluminum (Al), the like, or a combination thereof. The interconnect metal layers 242 may interconnect various devices formed in and/or on the semiconductor substrate 236, including the Hall elements 102.

The semiconductor die 234 also includes a protective dielectric layer 246 over the interconnect structure 238. More specifically, the protective dielectric layer 246 is over the interconnect metal layer 242 that includes the metal external connector bond pad 244. In an example, the metal external connector bond pad 244 is included in a top-most interconnect metal layer 242 of the interconnect structure 238. An opening through the protective dielectric layer 246 exposes the metal external connector bond pad 244. The protective dielectric layer 246 may be or include various dielectric materials, such as silicon oxide, silicon nitride, silicon oxynitride, or the like.

The Hall effect sensor system 200 includes a polymer layer 248 over the protective dielectric layer 246. An opening through the polymer layer 248 corresponds with and aligns with the opening through the protective dielectric layer 246 that exposes the metal external connector bond pad 244. In some examples, the polymer layer 248 is polyimide or the like. The polymer layer 248 has a thickness 250. Here, thickness 250 refers to a size of the polymer layer 248 in a direction perpendicular to the substrate surface 236. In some examples, the thickness 250 of the polymer layer 248 is equal to or greater than 3 μm, such as in a range from 3 μm to 15 μm. In some examples, the polymer layer 248 is omitted.

The magnetic concentrator 202 is over and supported by a same surface of the semiconductor die 232, accordingly, they are on a same side of the semiconductor die 232. In the example illustrated by FIG. 2D, the magnetic concentrator 202 is over or on the polymer layer 248. In some other examples, such as when the polymer layer 248 is omitted, the magnetic concentrator 202 is over or on the protective dielectric layer 246.

As described above, the magnetic concentrator 202 includes a magnetic material. In some examples, the magnetic concentrator 202 includes one or more of cobalt, nickel, iron, a binary alloy thereof such as nickel iron (NiFe) alloy, and/or a ternary alloy thereof. In some examples, the magnetic concentrator 202 includes a single layer of magnetic material. In some examples, the magnetic concentrator 202 includes layers of different magnetic materials.

The magnetic concentrator 202 is arranged with the interconnect structure 238, the protective dielectric layer 246, and the polymer layer 248 vertically between the Hall elements 102 and the magnetic concentrator 202. In this context, vertical refers to a Z direction, accordingly, a direction perpendicular to the substrate surface 236.

The magnetic concentrator 202 has a thickness 252, such as in a direction perpendicular to the substrate surface 236. A distance 254 is a Z direction component of a distance between the Hall elements 102 (in some examples, the substrate surface 236) and the magnetic concentrator 202. In some examples, the distance 254 equals the sum of the thicknesses of the interconnect structure 238, the protective dielectric layer 246, and, if present, the polymer layer 248. In some examples, the distance 254 is equal to or greater than 5 μm, such as in a range from 5 μm to 100 μm.

Figure 3A:
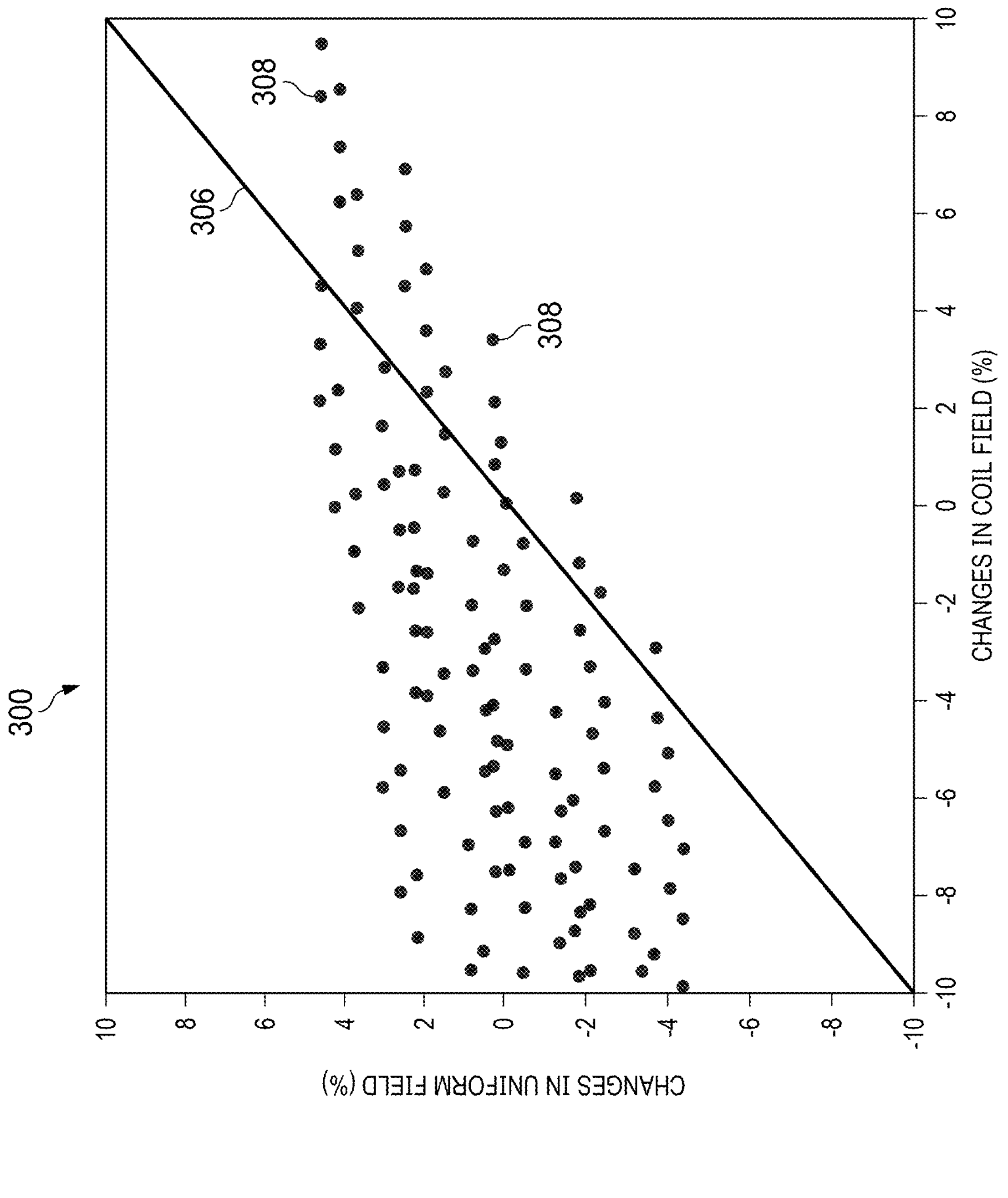
FIG. 3A is a first example graph of percent change in Hall sensor response to a uniform magnetic field against percent change in Hall sensor response to a magnetic field generated by a first example on-chip coil.
Figure 3B:
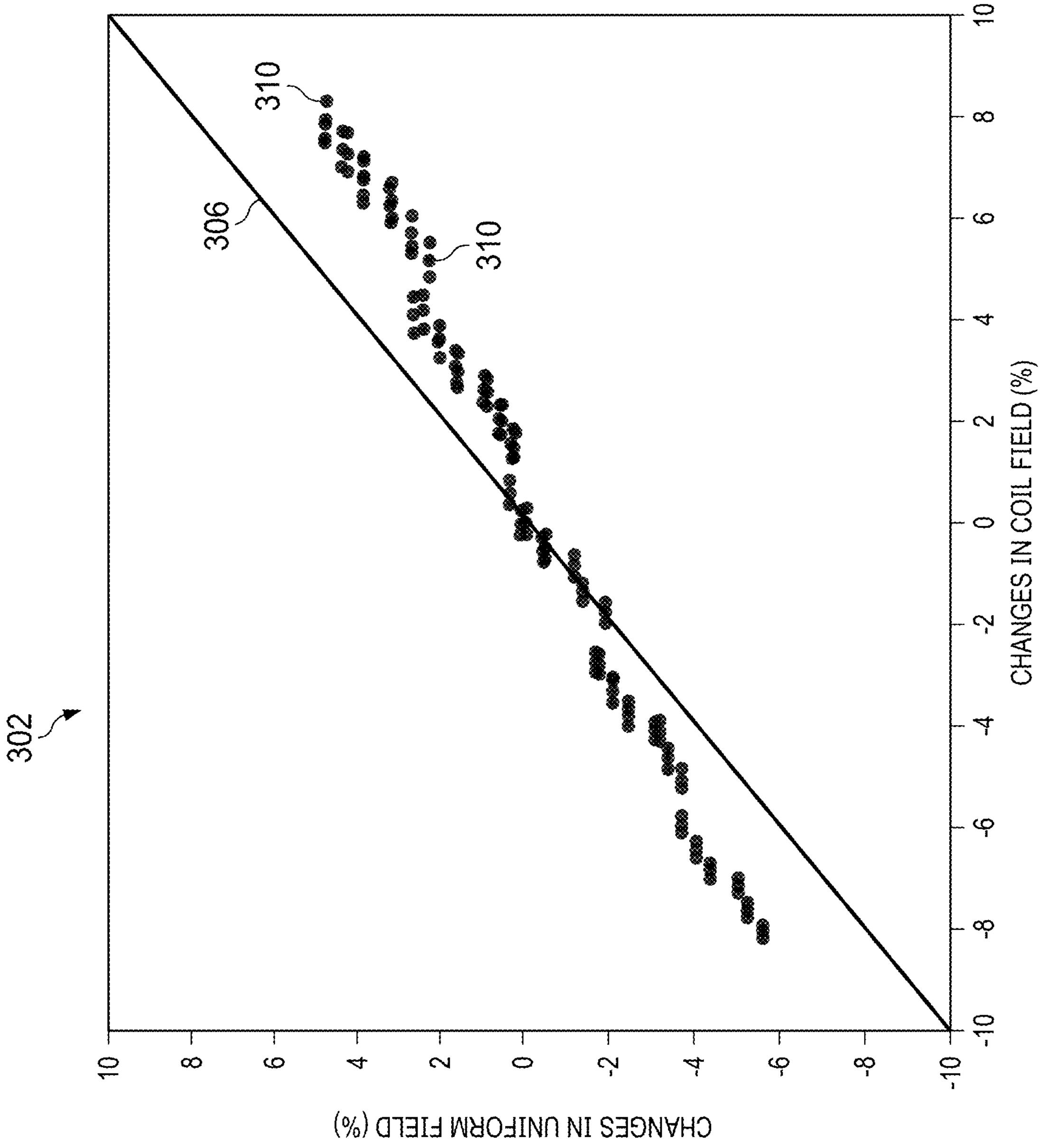
FIG. 3B is a second example graph of percent change in Hall sensor response to a uniform magnetic field against percent change in Hall sensor response to a magnetic field generated by a second example on-chip coil.
Figure 3C:
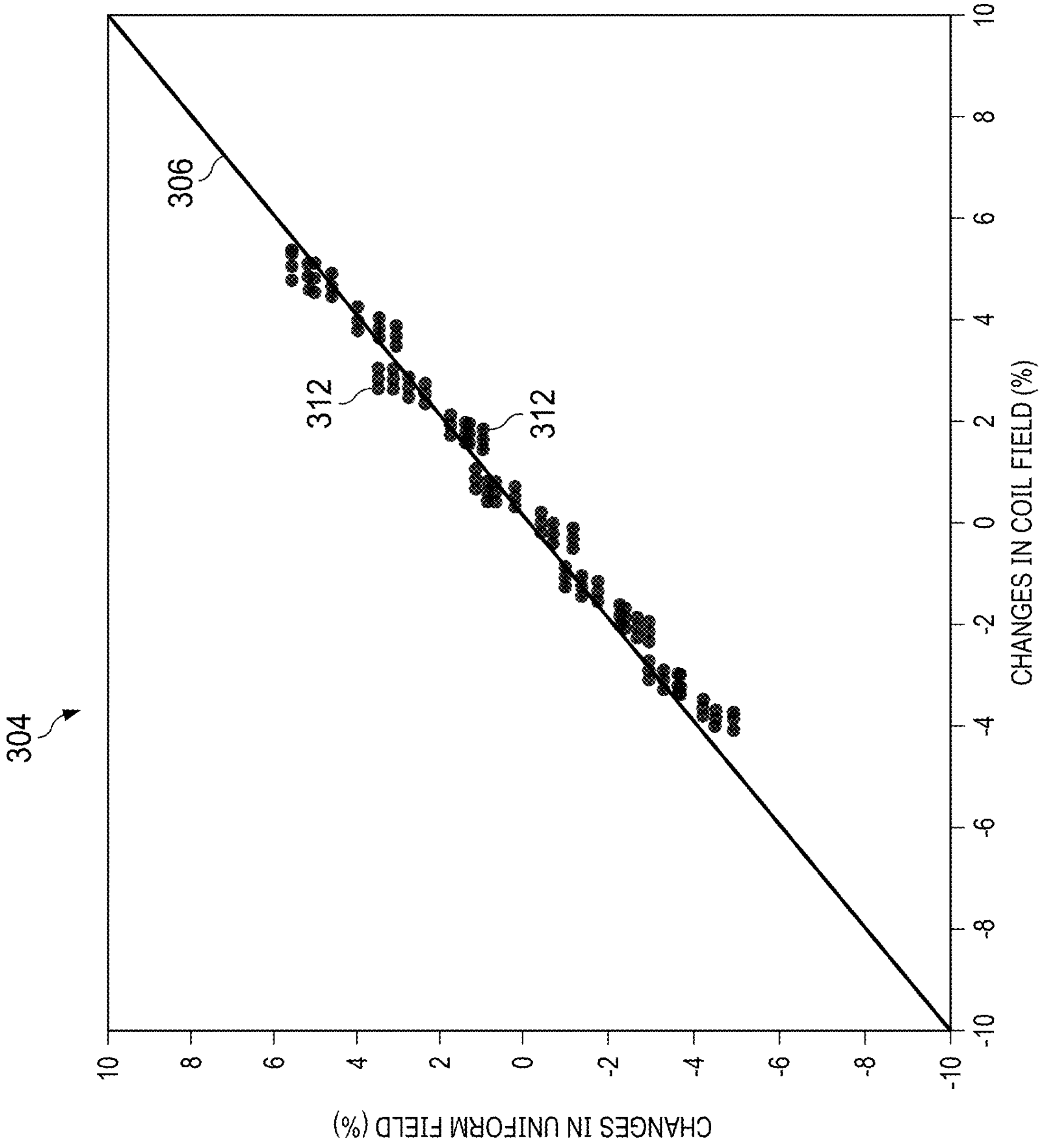
FIG. 3C is a third example graph of percent change in Hall sensor response to a uniform magnetic field against percent change in Hall sensor response to a magnetic field generated by example complementary primary and secondary on-chip coils.

FIG. 3A is a first example graph 300 of percent change in Hall sensor response to a uniform magnetic field against percent change in Hall sensor response to a magnetic field generated by a first example on-chip coil. FIG. 3B is a second example graph 302 of percent change in Hall sensor response to a uniform magnetic field against percent change in Hall sensor response to a magnetic field generated by a second example on-chip coil. FIG. 3C is a third example graph 304 of percent change in Hall sensor response to a uniform magnetic field against percent change in Hall sensor response to a magnetic field generated by example complementary primary and secondary on-chip coils.

In each of the graphs 300, 302, and 304, a horizontal axis corresponds to process variation-related percent change in Hall sensor response to a magnetic field generated by an on-chip coil or coils, with respect to a designed response level of a Hall effect sensor system. A vertical axis corresponds to process variation-related percent change in Hall sensor response to a uniform magnetic field, with respect to a designed response level of the Hall effect sensor system.

Hall effect sensor systems corresponding to the graph 300 of FIG. 3A and the graph 302 of FIG. 3B include a magnetic concentrator, an on-chip coil, and a Hall effect sensor, such as described with respect to FIGS. 2A, 2B, 2C, and 2D. A Hall effect sensor system 400 corresponding to the graph 304 of FIG. 3C includes a magnetic concentrator, complementary primary and secondary on-chip coils, and a Hall effect sensor, and is further described with respect to FIG. 4.

A slope (rise/run) of a line through the origin in the graphs 300, 302, and 304 corresponds to a correlation coefficient (1+run/100): (1+rise/100).

The graph 300 includes an (ideal) 1:1 correlation coefficient line 306 with slope equal to one, and multiple data points 308. Each of the data points 308 corresponds to measured (for example, simulated) response levels of a different fabricated IC including a same first single-coil design of Hall effect sensor system, with respective different process variation. The data point 308 cloud in the graph 300 is relatively diffuse, and deviates significantly from the 1:1 correlation coefficient line 306. In some examples, the graph 300 corresponds to a Hall effect sensor system with varied correlation coefficients for different components.

The graph 302 includes the 1:1 correlation coefficient line 306 and multiple data points 310. Each of the data points 310 corresponds to measured (for example, simulated) response levels of a different fabricated IC including a same second single-coil design of Hall effect sensor system, with respective different process variation. The data point 310 cloud in the graph 302 closely conforms to a 0.7:1 correlation coefficient line. In some examples, the graph 302 corresponds to a Hall effect sensor system that has been designed to have matching correlation coefficients for different components The graph 304 includes the 1:1 correlation coefficient line 306, and multiple data points 312. Each of the data points 312 corresponds to measured (for example, simulated) response levels of a different fabricated IC including a same complementary (primary and secondary) coil design of Hall effect sensor system, with respective different process variation. The data point 312 cloud in the graph 304 closely conforms to the 1:1 correlation coefficient line, for example, with error less than 1%. This error corresponds to a proportional difference between coil field response and uniform field response across process variation conditions. In some examples, the graph 304 corresponds to a Hall effect sensor system that has been designed so that correlation coefficients related to a primary coil and correlation coefficients related to a secondary coil combine to reach 1:1, as described above with respect to Equation 1.

Conformance of data points 312 of FIG. 3C to the 1:1 correlation coefficient line 306 is enabled by a Hall effect sensor system that uses a complementary coil system, including primary and secondary coils, to emulate the magnetic field that intersects with Hall elements 102 responsive to a uniform magnetic field 204. The Hall effect sensor system 400 of FIG. 4 is an example of such a complementary coil system.

FIG. 4 is a bottom-up view of a fourth example Hall effect sensor system 400 including linear arrays of Hall elements 402, a magnetic concentrator 404, a primary coil 406, and secondary coils 408. The Hall effect sensor system 400 is manufactured on a semiconductor substrate 234 such as a semiconductor wafer, and includes a first linear array of Hall elements 402*a*, a second linear array of Hall elements 402*b*, a first secondary coil 408*a*, and a second secondary coil 408*b*.

The linear Hall element array 302 includes multiple Hall elements, such as Hall elements 102, arranged in a line parallel to a substrate surface. In some examples, use of multiple Hall elements 102 increases SNR, and linear arrangement of the Hall elements 102 facilitates routing layout.

In the illustrated example, each linear array of Hall elements 402 includes six Hall elements 102. In some examples, a grouping of Hall elements 102 is a different shape than a linear array, or includes a different number of Hall elements 102, such as between one and ten Hall elements 102. In some examples, Hall elements 102 connected in series increase a level of noise or reduce an SNR, and Hall elements 102 connected in parallel reduce a level of noise or increase an SNR. In some examples, a number of Hall elements 102 is selected responsive to a designed SNR.

The magnetic concentrator 404 is octagonal, has a primary axis and a secondary axis that are parallel to the substrate surface and perpendicular to each other, and has a constant thickness in a direction perpendicular to the substrate surface. In some examples, the magnetic concentrator 404 is shaped like a rectangle with corners cut off. In some examples, a primary axis of the magnetic concentrator 404 is a long axis, and a secondary axis of the magnetic concentrator 404 is a short axis. Herein, a direction parallel to the short axis of the magnetic concentrator 404 will be referred to as an X direction, a direction parallel to the long axis of the magnetic concentrator 404 will be referred to as a Y axis, and a direction perpendicular to the substrate surface will be referred to as a Z direction, as indicated by X-Y-Z coordinate arrows indicating these reference directions in FIG. 4.

The primary coil 406 and secondary coils 408 are each a metal line arranged in a spiral having a number of turns. Generally, a set of four segments ending with 90 degree turns spans one rectangle, with one of the four segments sufficiently longer than the other three so as to provide a continuous path to a next set of four segments. Each set of four segments is referred to as a turn. Each turn is at a different distance from a center point of the coil. The coil includes a number of turns; FIG. 4 illustrates approximately eight turns. There are spaces between adjacent turns of respective primary and secondary coils 406 and 408. Design parameters of the primary coil 406 and secondary coils 408 include Z direction thickness of metal lines, segment width of metal lines, spacing between adjacent pairs of turns or segments within a coil, inner and outer distances in an X direction, inner and outer distances in a Y direction, and a distance between the secondary coils 408. These parameters are further described with respect to FIG. 7.

For subsequent reference of structural positional relationships, certain terms with respect to overlap are first described. Two components overlapping is defined as the components being located so that at least one line perpendicular to the substrate surface intersects both of the components. Two components partially overlapping is defined as the components being located so that they overlap and so that there exists, for each component, at least one line through the component and perpendicular to the substrate surface that does not intersect the other component. And two components fully or completely overlapping is defined as the components being located so that, for at least one of the two components, all lines through that component and perpendicular to the substrate surface intersect the other component.

Herein, an edge refers to a furthest edge of a component from a center of the magnetic concentrator 404 when viewed in a direction perpendicular to the substrate surface, such as the Z direction. A side of the primary coil 406 or a secondary coil 408 refers to the segments that are adjacent and parallel to each other and that include a segment corresponding to an edge of the respective primary coil 406 or secondary coil 408.

Viewed in the Z direction, a majority of the X-Y plane covered by the primary coil 406 overlaps with the magnetic concentrator 404. There is a non-overlapping region between the primary coil 406 and the magnetic concentrator 404 where the corners of the primary coil 406 extend beyond the magnetic concentrator 404 at the corner-cutouts of the magnetic concentrator 404. The magnetic concentrator 404 is longer in the X direction and in the Y direction than the primary coil 406. The first linear array of Hall elements 402*a* partially overlaps the magnetic concentrator 404 and the primary coil 406 at a first long edge of the magnetic concentrator 404 and a first long edge of the primary coil 406. The first linear array of Hall elements 402*a* is surrounded by and does not overlap the first secondary coil 408*a*. The first secondary coil 408*a* surrounds a portion of the first long edge of the magnetic concentrator 404. The magnetic concentrator is longer in the X direction and in the Y direction than both of the secondary coils 408.

The second linear array of Hall elements 402*b* partially overlaps the magnetic concentrator 404 and the primary coil 406 at a second long edge of the magnetic concentrator 404 and a second long edge of the primary coil 406. The second linear array of Hall elements 402*b* is surrounded (looking in the Z direction) by, and does not overlap, the second secondary coil 408*b*. The second secondary coil 408*a* surrounds (looking in the Z direction) a portion of the first long edge of the magnetic concentrator 404.

The primary coil 406 and secondary coils 408 have long and short axes respectively aligned with the long and short axes of the magnetic concentrator 404. A long axis of the magnetic concentrator 404, a long axis of the primary coil 406, and a long axis of the secondary coils 408 are approximately parallel to a long axis of the first linear array of Hall elements 402*a* and a long axis of the second linear array of Hall elements 402*b*. The long axis of a linear array of Hall elements 402 is a line along which the linear array of Hall elements 402 is disposed. In some examples, a rotational misalignment of components of the Hall effect sensor system 400 is relatively small, such that there is a negligible effect on correlation coefficients.

The short sides of the first secondary coil 408*a* have similar coil width as, are aligned with, and partially overlap respective short sides of the primary coil 406 near the first long edge of the primary coil 406. Turn width refers to a width of each of the conductive lines (turns) that form a respective coil, also called a trace width. Coil width refers to a sum of the widths of each the conductive lines that form a respective coil plus spaces between the conductive lines. In some examples, coil widths or turn widths of a primary coil 406 and a secondary coil 408 are similar or the same. In some examples, coil widths or turn widths of a primary coil 406 and a secondary coil 408 are different. Here, near means in relative proximity to with respect to a more distant opposite edge of the primary coil 406.

The short sides of the second secondary coil 408*b* have similar coil width as, are aligned with, and partially overlap respective short sides of the primary coil 406 near the second long edge of the primary coil 406. In the illustrated example, turn widths and spacing of the primary coil 406 and the secondary coils 408 are similar or the same. In some examples, coil widths and turn widths are designed in response to a trade-off between resistance and size.

In some examples, primary coils 406 or secondary coils 408 are each implemented on a single metal layer. In some examples, one or more of the primary coils 406 or secondary coils 408 are implemented on multiple metal layers to save device area. In some examples, the primary coil 406 is closer to the magnetic concentrator 404 than the secondary coils 408. In some examples, the secondary coils 408 are closer to the magnetic concentrator 404 than the primary coil 406.

Figure 5A:
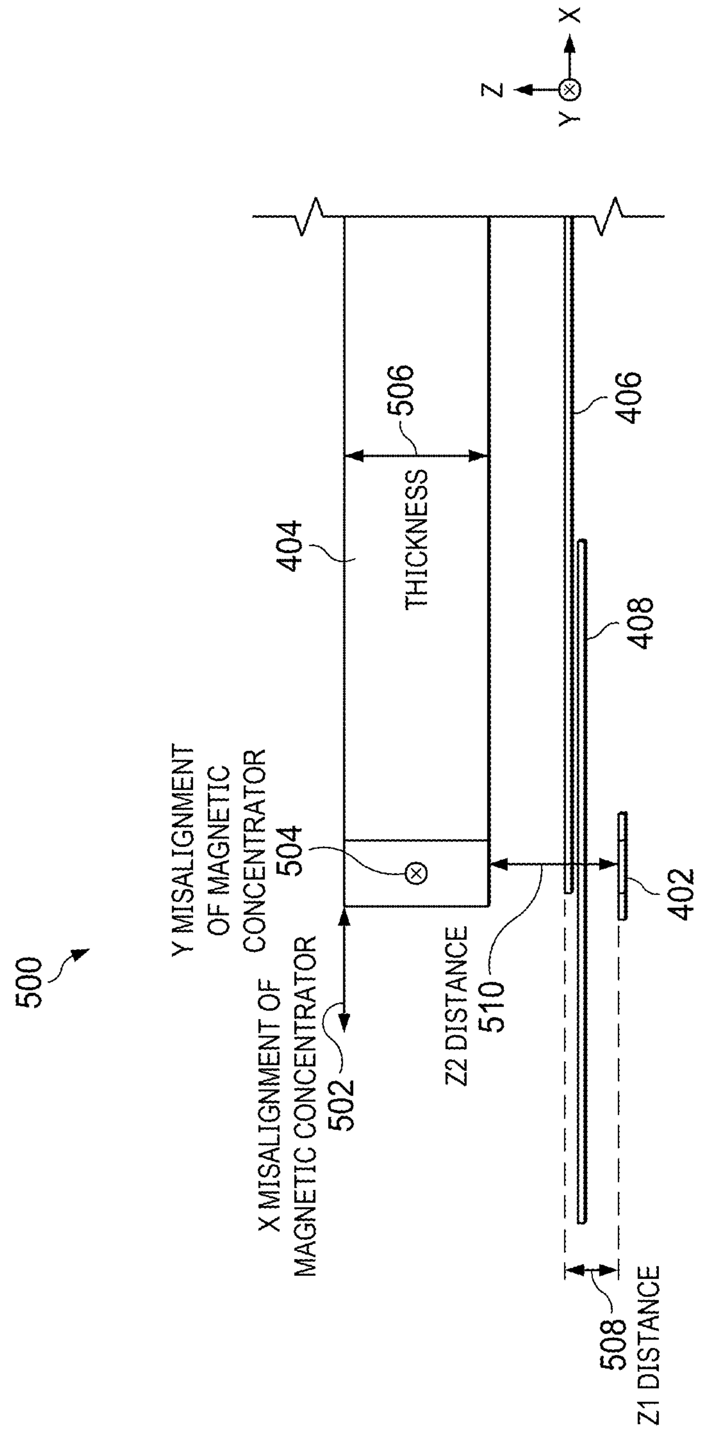
FIG. 5A is a first side view of the example Hall effect sensor system of FIG. 4.

FIG. 5A is a first side view 500 of the example Hall effect sensor system 400 of FIG. 4. The side view 500 is taken in the Y dimension, parallel to the long axis of the magnetic concentrator 404.

The side view 500 shows several parameters that impact the resultant correlation coefficients. These parameters include an X misalignment 502, a Y misalignment 504, a thickness 506, a Z1 distance 508, and a Z2 distance 510. The X misalignment 502 is a misalignment in the X dimension of the magnetic concentrator 404 with respect to a designed position relative to the linear arrays of Hall elements 402 and the primary and secondary coils 406 and 408. The Y misalignment 504 is a misalignment of the magnetic concentrator 404 in the Y dimension with respect to a designed position relative to the linear arrays of Hall elements 402 and the primary and secondary coils 406 and 408. The thickness 506 is the thickness 506 of the magnetic concentrator (the magnetic concentrator thickness 506) 404 in the Z dimension. The Z1 distance 508 is a vertical distance between respective top surfaces of the primary coil 406 and Hall elements 102 within the linear arrays of Hall elements 402. The Z2 distance 510 is a vertical distance between a bottom surface of the magnetic concentrator 404 and a top surface of Hall elements 102 within the linear arrays of Hall elements 402. The Y misalignment 504 is shown as an into the board symbol, accordingly, parallel to a viewing direction of the page. In some examples, parameters are measured between different surfaces of components than shown, or different parameters are used, for a process for setting an overall correlation coefficient of the Hall effect sensor system 400 to equal 1:1.

In some examples, the Z2 distance 510 shows a relatively largest amount of process variation, such as in comparison to process variation of the Z1 distance 508, the X misalignment 502, etc. Accordingly, in some examples, the Z2 distance 510 is selected first, and other parameters are selected responsive to the Z2 distance 510 or the correlation coefficient(s) corresponding to Z2 distance 510 variation. In some examples, other parameters are selected first, or are selected independently of the Z2 distance 510 or other first-selected parameter.

In some examples, the Z1 distance 508 and the Z2 distance 510 are determined responsive to a silicon manufacturing process used to fabricate a Hall effect sensor system 400. A process to adjust system design to set correlation coefficients corresponding to X misalignment 502, Y misalignment 504, magnetic concentrator thickness 506 variation, Z1 distance 508 variation, and Z2 distance 510 variation to equal 1:1 (within designed acceptable error) is described with respect to FIG. 6, Example design considerations to adjust a correlation coefficient corresponding to Z1 distance 508 variation are described with respect to FIGS. 7A and 7B. In some examples, X misalignment 502 and Y misalignment 504 are responsive to layer-to-layer alignment errors and/or device assembly errors. In some examples, device assembly errors include errors in a pick-and-place process for adding the magnetic concentrator 404 to an IC package in which the Hall effect sensor system 400 is fabricated. Example design considerations to adjust correlation coefficients corresponding to X misalignment 502, Y misalignment 504, and the magnetic concentrator thickness 506 variation are described with respect to FIG. 8. In some examples, similar design considerations apply to measurements and correlation coefficients of the secondary coil(s) 408 as apply to the primary coil 406.

Figure 5B:
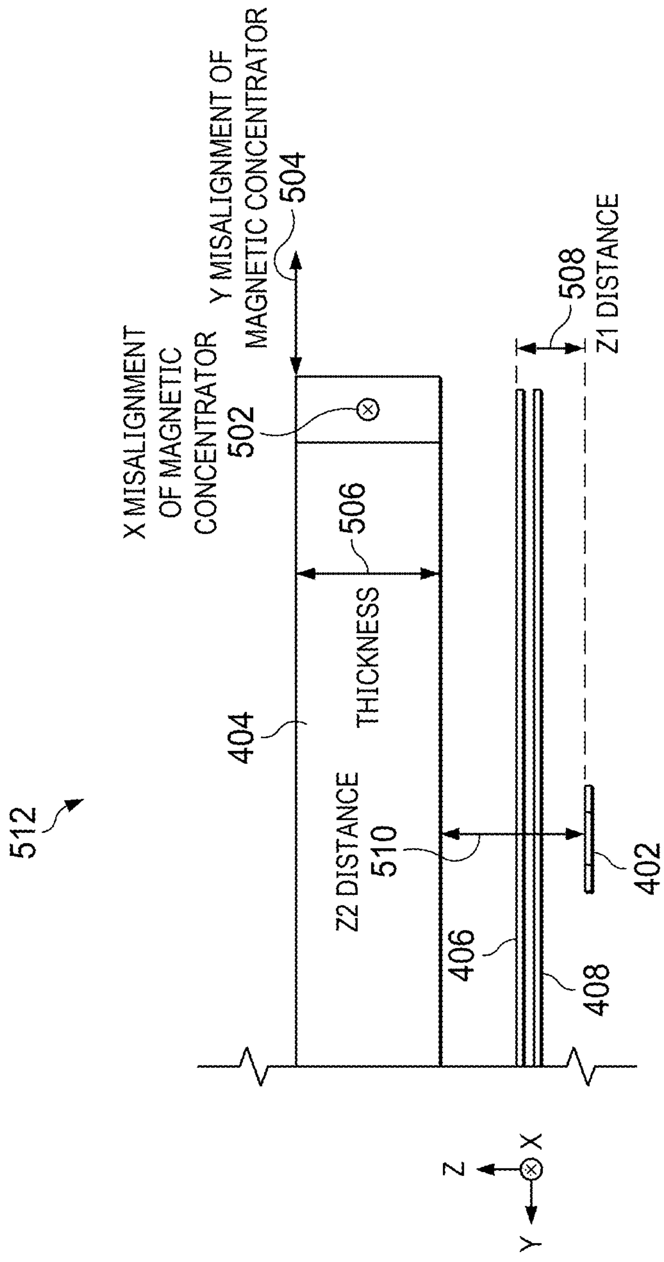
FIG. 5B is a second side view of the example Hall effect sensor system of FIG. 4.

FIG. 5B is a second side view 512 of the example Hall effect sensor system 400 of FIG. 4. The side view 512 is taken in the X dimension, parallel to the short axis of the magnetic concentrator 404.

Figure 6:
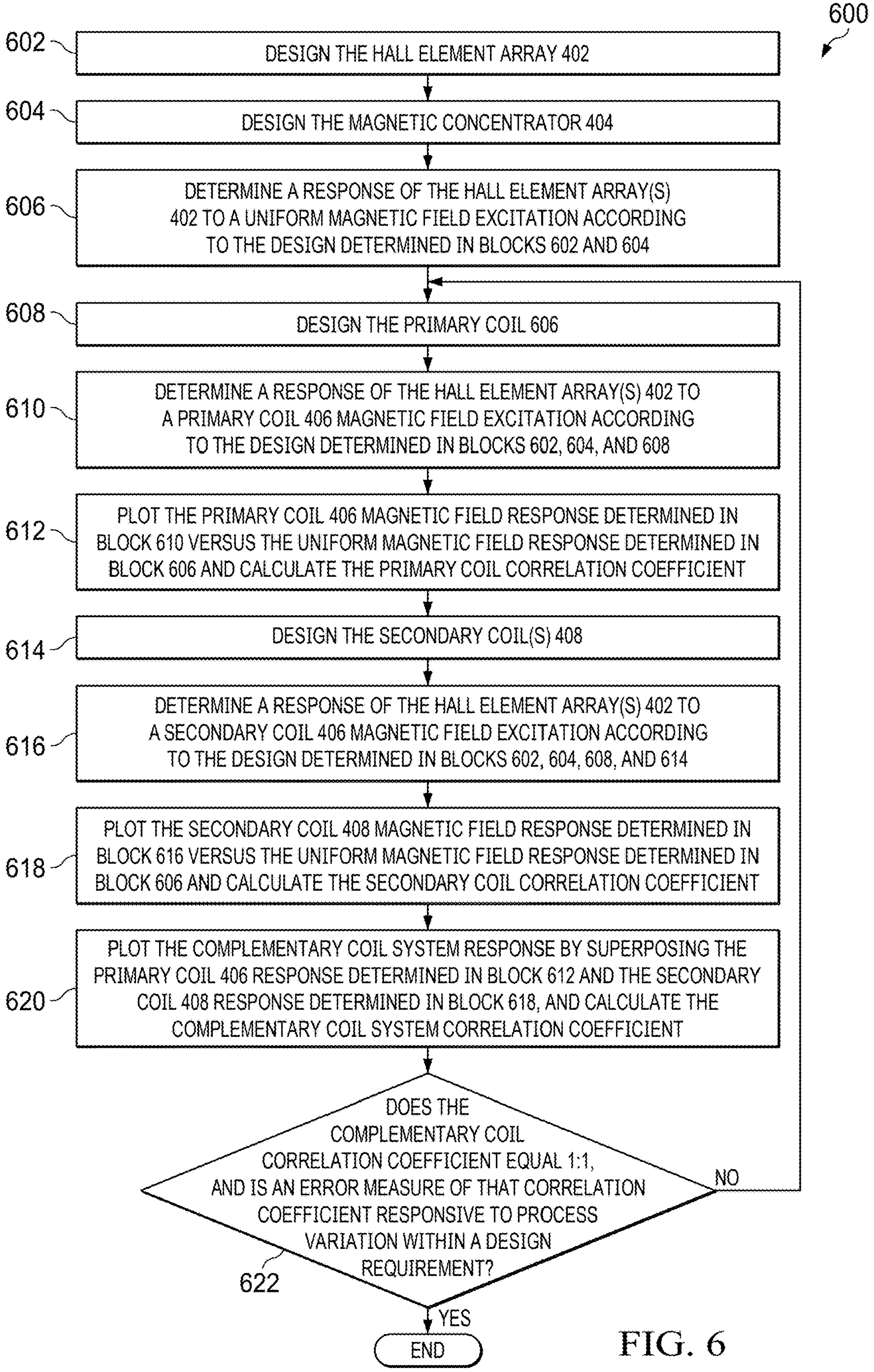
FIG. 6 is a process for selecting size and positioning parameters of the Hall effect sensor system.

FIG. 6 is a process 600 for selecting size and positioning parameters of the Hall effect sensor system 400. Specifically, the process 600 is used to set correlation coefficients corresponding to process variability of parameters of the Hall effect sensor system 400 to equal or approximate 1:1. In some examples, the process 600 enables correlation coefficients to be set to 1:1 so that overall correlation coefficients for a Hall effect sensor system 400 equal 1:1 with less than 1% error. In some examples, an iterative design and test approach, such as using simulation to test design updates, is used to determine component parameters to converge correlation coefficients to designed values.

As preface to description of the process 600, certain variables are defined. "A" refers to a dimension, such as an X, Y, or Z dimension in an X-Y-Z coordinate system, or an R, θ (theta), or φ (phi) dimension in a rotational R-θ-φ coordinate system (other coordinate systems can also be used). "B" refers to a size of a component, or a distance between two components, in a dimension A. MC is the magnetic concentrator 404, PCOIL is the primary coil 406, SCOIL is a secondary coil 408, and HALL is a Hall element 102. "ERR" refers to error, and may be appended to a variable to describe an error in that variable.

These elements enable definition of variables of the form A_B, referring to a size of a component (B) such as MC, PCOIL, SCOIL, or HALL in a dimension (A) such as X, Y, or Z. There are also variables of the form A_B1_B2, referring to a distance from a first component (B1) to a second component (B2) in the dimension A. A_B_ERR is an error in a size of a component in a dimension, and A_B1_B2_ERR is an error in a distance between two components in a dimension. These error values correspond to process variations in respective A_B sizes and A_B1_B2 distances.

For example, X_MC, Y_MC, and Z_MC refer to the size of the magnetic concentrator 404 in dimensions X, Y, and Z, respectively. In some examples, different or additional variable names can be used to indicate inside coil widths, corresponding to distances between proximate edges of opposing sides of a coil, and/or outside coil widths, corresponding to distances between distal edges of opposing sides of the coil.

X_HALL, Y_HALL, and Z_HALL refer to the size of a Hall element 102 (in some examples, each Hall element 102) in dimensions X, Y, and Z, respectively. X_PCOIL, Y_PCOIL, and Z_PCOIL refer to the size of the primary coil 406 in dimensions X, Y, and Z, respectively. Equivalent values may be used for X_PCOIL and Y_PCOIL if the primary coil 406 is implemented on multiple layers. X_SCOIL, Y_SCOIL, and Z_SCOIL refer to the size of a secondary coil 408 in dimensions X, Y, and Z, respectively. Equivalent values may be used for X_SCOIL and Y_SCOIL if the secondary coil 408 is implemented on multiple layers.

Similarly, Z_PCOIL_HALL is a distance in the Z dimension between the primary coil 406 and a Hall element 102. In some examples, an equivalent value is used for Z_PCOIL_HALL if the primary coil 406 is fabricated on multiple layers. Z_SCOIL_HALL is a distance in the Z dimension between a secondary coil 408 and a Hall element 102. In some examples, an equivalent value is used for Z_SCOIL_HALL if the secondary coil 408 is fabricated on multiple layers. And Z_MC_PCOIL is a distance in the Z dimension between the magnetic concentrator 404 and the primary coil 406.

Note that distances in a same dimension between two components can be calculated using distances between those components and a third component. For example, Z_MC_PCOIL=Z_MC_HALL-Z_PCOIL_HALL.

Returning to FIG. 6, in block 602, design the Hall element array 402, including by determining X_HALL, Y_HALL, and Z_HALL for Hall elements 102 of the Hall element array 402. In some examples, X_HALL, Y_HALL, and Z_HALL are determined responsive to a sensitivity and a resistance of the respective Hall elements 102. In some examples, a size of Hall element array 402, such as a number of Hall elements 102, is responsive to an SNR requirement.

In block 604, design the magnetic concentrator 404, including by determining X_MC, Y_MC, and Z_MC. Distance between the magnetic concentrator 404 and the Hall element array 402 is also determined. In some examples, X_MC is determined responsive to one or more dimensions of the secondary coil(s) 408 or a spacing between secondary coils 408. Y_MC is determined responsive to one or more dimensions of the Hall element array(s) 402. And X_MC, Y_MC, and Z_MC are determined responsive to a magnetic field detection range.

In block 606, determine a response of the Hall element array(s) 402 to a uniform magnetic field excitation according to the design determined in blocks 602 and 604. In some examples, this is done by simulating a response of the Hall element array 402 and magnetic concentrator 404 to uniform magnetic field excitation. The simulation is repeated with various errors (process variations) introduced, corresponding to A_B_ERR and A_B1_B2_ERR. B, B1, and/or B2 is, for example, a Hall element 102 or the magnetic concentrator 404. Accordingly, the simulation is repeated so that A_B+A_B_ERR is substituted for one or more corresponding A_B, and/or A_B1_B2+A_B1_B2_ERR is substituted for one or more corresponding A_B1_B2.

In block 608, design the primary coil 606, including by determining X_PCOIL, Y_PCOIL, and Z_PCOIL. Distances between the primary coil 406 and the Hall element array 402 or the magnetic concentrator 404 are also determined. In some examples, X_PCOIL is the major design parameter, Y_PCOIL is limited by one or more dimensions of the Hall element array(s) 402, and Z_PCOIL is determined by a manufacturing process. Also, a number of turns of the primary coil 406 is limited by a maximum supply voltage.

In block 610, determine a response of the Hall element array(s) 402 to a primary coil 406 magnetic field excitation according to the design determined in blocks 602, 604, and 608. In some examples, this is done by simulating a response of the Hall element array 402 and magnetic concentrator 404 to primary coil 406 magnetic field excitation. The simulation is repeated with process variations introduced as described with respect to block 606.

In block 612, plot the primary coil 406 magnetic field response determined in block 610 versus the uniform magnetic field response determined in block 606 and calculate the primary coil correlation coefficient. In some examples, the primary coil 406 correlation coefficient corresponds to a slope of a best-fit line of this plot. In some examples, the primary coil 406 correlation coefficient can be described as a weighted accumulation of component correlation coefficients related to the primary coil 406.

In block 614, design the secondary coil(s) 408, including by determining X_SCOIL, Y_SCOIL, and Z_SCOIL. In some examples, X_SCOIL is the major design parameter, Y_SCOIL is limited by one or more dimensions of the Hall element array(s) 402, and Z_SCOIL is determined by a manufacturing process. Also, a number of turns of the secondary coil 408 is limited by a maximum supply voltage and by a primary coil 406 response. Primary coil 406 response controls an overall correlation coefficient related to the primary coil 406. Similarly, secondary coil 408 response controls an overall correlation coefficient related to the secondary coil 408. Accordingly, secondary coil 408 design is responsive to and limited by primary coil 406 response, so that the overall correlation coefficient for the primary coil 406 plus the overall correlation coefficient for the secondary coil 408 equals 1:1.

In block 616, determine a response of the Hall element array(s) 402 to a secondary coil 408 magnetic field excitation according to the design determined in blocks 602, 604, 608, and 614. In some examples, this is done by simulating a response of the Hall element array 402 and magnetic concentrator 404 to secondary coil 408 magnetic field excitation. The simulation is repeated with process variations introduced as described with respect to block 606. In some examples, a distance between primary and secondary coils 406 and 408 is relatively small compared to, for example, Z1 and Z2 distances 508 and 510, so that determining a Z location of the primary coil 406 determines a Z location of the secondary coil 408.

In block 618, plot the secondary coil 408 magnetic field response determined in block 616 versus the uniform magnetic field response determined in block 606 and calculate the secondary coil correlation coefficient. In some examples, the secondary coil 408 correlation coefficient corresponds to a slope of a best-fit line of this plot. In some examples, the secondary coil 408 correlation coefficient can be described as a weighted accumulation of component correlation coefficients related to the secondary coil 408.

In block 620, plot the complementary coil system response by superposing the primary coil 406 response determined in block 612 and the secondary coil 408 response determined in block 618, and calculate the complementary coil system correlation coefficient. As described above, complementary coil system refers to the Hall effect sensor system 400 that includes both the primary coil 406 and the secondary coil(s) 408. In some examples, the complementary coil system correlation coefficient corresponds to a slope of a best-fit line of this plot. In some examples, the complementary coil system correlation coefficient can be described as a weighted accumulation of component correlation coefficients related to both the primary coil 406 and the secondary coil 408.

In block 622, repeat steps 608 through 620 until the complementary coil system reaches a correlation coefficient of 1:1, and an error measure of that correlation coefficient responsive to process variation (corresponding to A_B_ERR and/or A_B1_B2_ERR) is within a design requirement. In some examples, design iteration includes varying design of the primary coil 406 and the secondary coil 408 so that the sum of the respective best-fit slopes determined in blocks 612 and 618 equals one, within an acceptable value (such as designed or requirements-compliant) error measure. In some examples, the error measure is a standard deviation or variance.

Figure 7A:
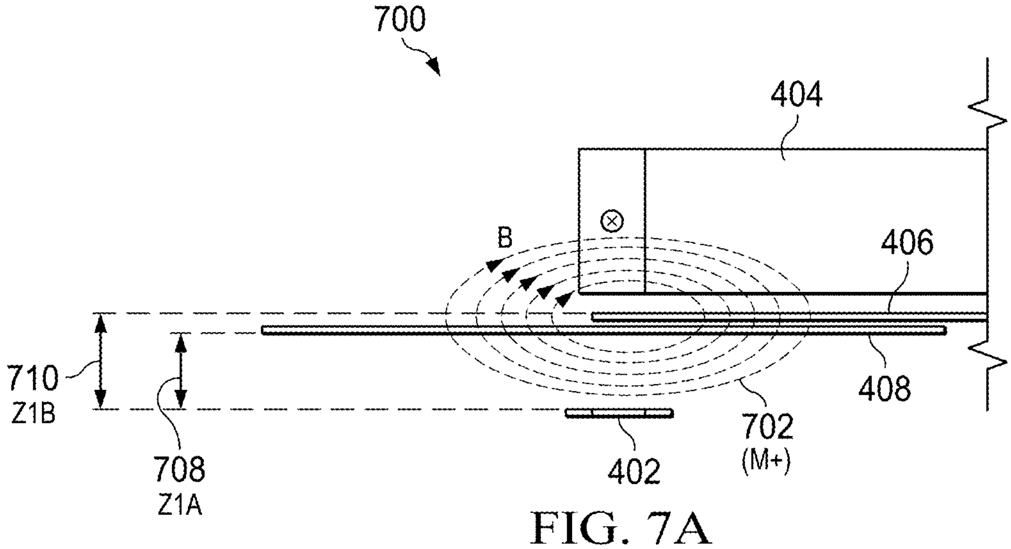
FIG. 7A is a first side view of a portion of the Hall effect sensor system of FIG. 4 with first magnetic field lines.
Figure 7B:
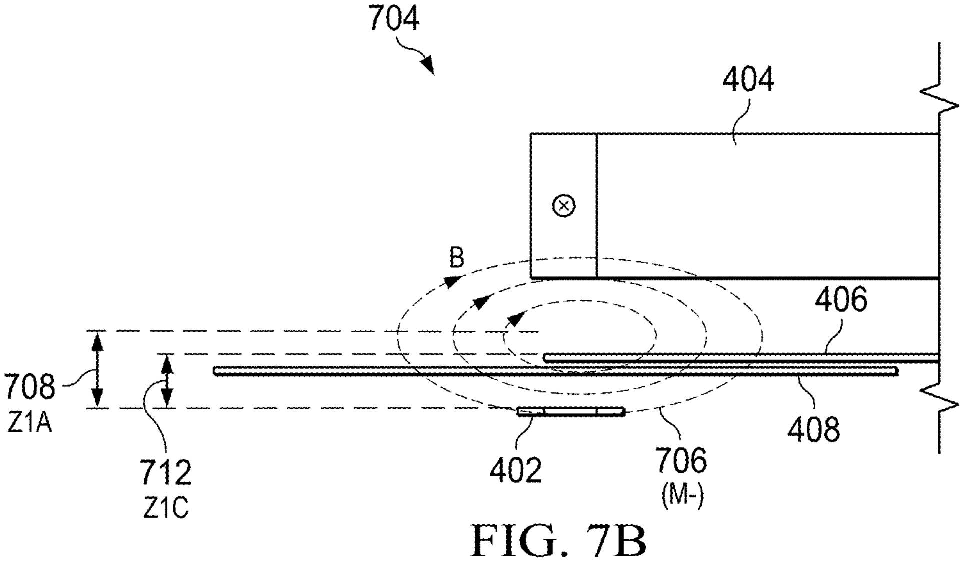
FIG. 7B is a second side view of the portion of the Hall effect sensor system of FIG. 4 with second magnetic field lines.

An example approach to selection of Z1 distance 508 is described with respect to FIGS. 7A and 7B. FIG. 7A is a first side view 700 of a portion of the Hall effect sensor system 400 of FIG. 4 with first magnetic field lines 702. FIG. 7B is a second side view 704 of the portion of the Hall effect sensor system 400 of FIG. 4 with second magnetic field lines 706. Note that the primary coil 406 is not used while the Hall effect sensor system 400 detects a uniform magnetic field, so that the correlation coefficients for Z1 distance 508 variation have a relatively low (or zero) weight. Accordingly, the Z1 distance 508 is selected so that process variations of the Z1 distance 508 will have reduced or minimal effect on Hall element 100 signal response.

A first example Z1 distance (Z1A) 708 is shown in both FIGS. 7A and 7B. At the distance Z1A 708, current through the primary coil 406 generates a magnetic field, which induces a magnetic field of a particular strength (not shown) in the magnetic concentrator 404, which results in the magnetic concentrator 404 emitting a magnetic field of strength M (an example value) to be detected by the Hall elements 102. The magnetic field generated by the primary coil 406 travels the distance Z1A 708 to be detected by the Hall elements 102, resulting in a corresponding contribution to Hall element 102 signal response.

A second example Z1 distance (Z1B) 710 is longer than Z1A 708. Z1B 710 locates the primary coil 406 closer to the magnetic concentrator 404 and further from the Hall elements 102. This results in the magnetic concentrator 404 emitting a magnetic field of strength M+, accordingly, a magnetic field stronger than M. The magnetic field of strength M+ is indicated by the first magnetic field lines 702. The magnetic field of strength M+responsive to the distance Z1B 710 results in increased signal response from the Hall elements 102 relative to the response for the magnetic field of strength M responsive to the distance Z1A 708. Meanwhile, the magnetic field produced by the primary coil 406 travels a greater distance (Z1B>Z1A) to be detected by the Hall elements 102, decreasing signal response from the Hall elements 102 relative to the response at the distance Z1A 708.

A third example Z1 distance (Z1C) 712 is shorter than Z1A 708. Z1C 712 locates the primary coil 406 further from the magnetic concentrator 404 and closer to the Hall elements 102. This results in the magnetic concentrator 404 emitting a magnetic field of strength M-, accordingly, a magnetic field weaker than M. The magnetic field of strength M- is indicated by the second magnetic field lines 706. The magnetic field of strength M-responsive to the distance Z1C 712 results in decreased signal response from the Hall elements 102 relative to the response for the magnetic field of strength M responsive to the distance Z1A 708. Meanwhile, the magnetic field produced by the primary coil 406 travels a lesser distance (Z1C<Z1A) to be detected by the Hall elements 102, increasing signal response from the Hall elements 102 relative to the response at the distance Z1A 708.

The Z1 distance 508 is selected to make Hall element 102 response to a coil-generated magnetic field less sensitive, or insensitive, to process variation in Z1 distance 508. In some examples, this can be done by determining a Z1 distance 508 that balances increase and decrease in Hall element 102 signal response responsive to Z1 distance 508 variation. Z1 distance 508 variation affects changes in the strength, as sensed by the Hall element 102, of (1) the magnetic field emitted by the magnetic concentrator 404 and (2) the magnetic field emitted by the primary coil 406. Field strength at the Hall element 102 of the magnetic field emitted by the magnetic concentrator 404 is responsive to the distance between the magnetic concentrator 404 and the primary coil 406. Field strength at the Hall element 102 of the magnetic field emitted by the primary coil 406 is responsive to the distance between the primary coil 406 and the Hall element 102.

Accordingly, a Z1 distance 508 is selected so that changes responsive to process variation from the selected Z1 distance 508 in the Hall element 102 signal response have equal magnitude and opposite sign with respect to contributions from (1) and contributions from (2). In some examples, this can be described as a response curve of the Hall element 102 responsive to a distance between the primary coil 406 and the magnetic concentrator 404 balancing a response curve of the Hall element 102 responsive to a distance between the primary coil 406 and the Hall element 102. In some examples, a minimum of a sum of change contributions from (1) and (2) responsive to Z1 distance 508 variation is found rather than a zero. In some examples, selecting a Z1 distance 508 corresponds to determining where a difference between derivatives of a response curve of (1) and a response curve of (2) equals zero or has a minimum. In some examples, selecting a Z1 distance 508 corresponds to selecting a metal layer in which to fabricate the primary coil 406.

Figure 8:
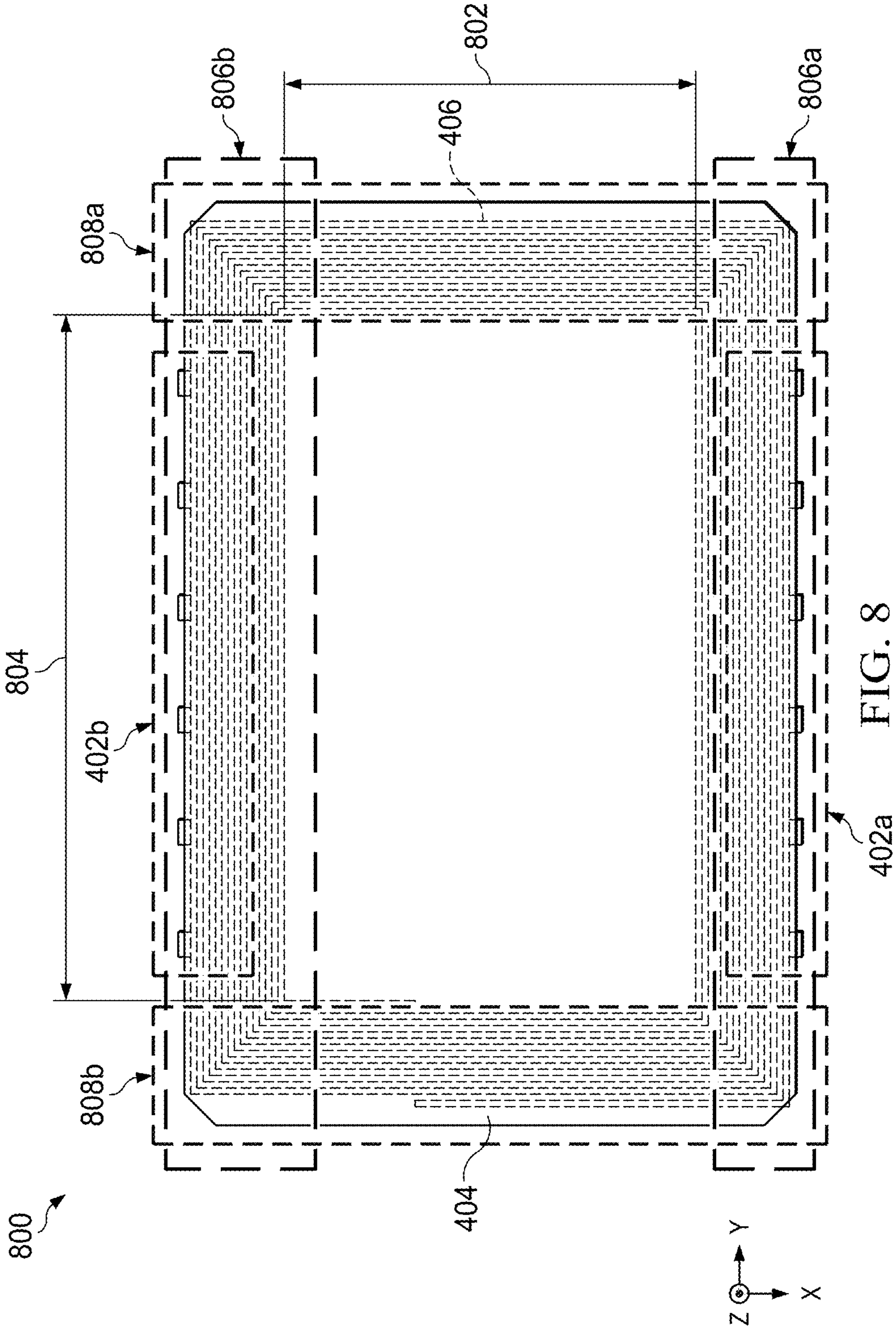
FIG. 8 is a partial top view of the Hall effect sensor system of FIG. 4.

FIG. 8 is a partial top view 800 of the Hall effect sensor system 400. Specifically, the secondary coils 408 are not included in the partial top view 800 to facilitate indication of component geometry parameters.

The correlation coefficient relating to the primary coil 406 and corresponding to X misalignment 502 of the magnetic concentrator is adjusted by selecting an inner X distance 802 and an inner Y distance 804 of the primary coil 406. The inner X distance 802 corresponds to a shortest distance in the X dimension between a first side 806*a* of the primary coil 406 and a second side 806*b* of the primary coil 406 that each have a long axis in the Y dimension. The inner Y distance 804 corresponds to a shortest distance in the Y dimension between a first side 808*a* of the primary coil 406 and a second side 808*b* of the primary coil 406 that each have a long axis in the X dimension.

The correlation coefficient corresponding to X misalignment 502 of the magnetic concentrator 404 is adjusted to equal the correlation coefficient for Z2 distance 510 variation by adjusting the inner X distance 802 and the inner Y distance 804, while keeping a magnetic field strength produced by the primary coil 406 high (or as high as possible). This is done responsive to a designed acceptable level of error and a designed (and/or required) magnetic field strength as received by the Hall elements 102. The designed magnetic field strength corresponds to a designed level of Hall element 102 output signal responsive to a corresponding strength of applied uniform magnetic field or coil-generated magnetic field. Hall element 102 output signal level is responsive to interactions among fields generated by the magnetic concentrator 404 and/or the primary and secondary coils 406 and 408.

Both uniform magnetic field response and coil field response are relatively insensitive to Y misalignment 504. The correlation coefficient relating to the primary coil 406 and corresponding to Y misalignment 504 of the magnetic concentrator 404 is very small, so that it can be regarded as a desired value for design purposes. Accordingly, the correlation coefficient corresponding to Y misalignment 504 can be taken to equal the correlation coefficient for Z2 distance 510 variation.

The correlation coefficient corresponding to magnetic concentrator thickness 506 variation varies primarily in response to the magnetic concentrator thickness 506, and is relatively insensitive to coil design. Accordingly, the magnetic concentrator thickness 506 is selected in response to the correlation coefficient for Z2 distance 510 variation and a linear field range requirement. In some examples, a minimum magnetic concentrator thickness 506 is responsive to a linear field range requirement.

Figure 9:
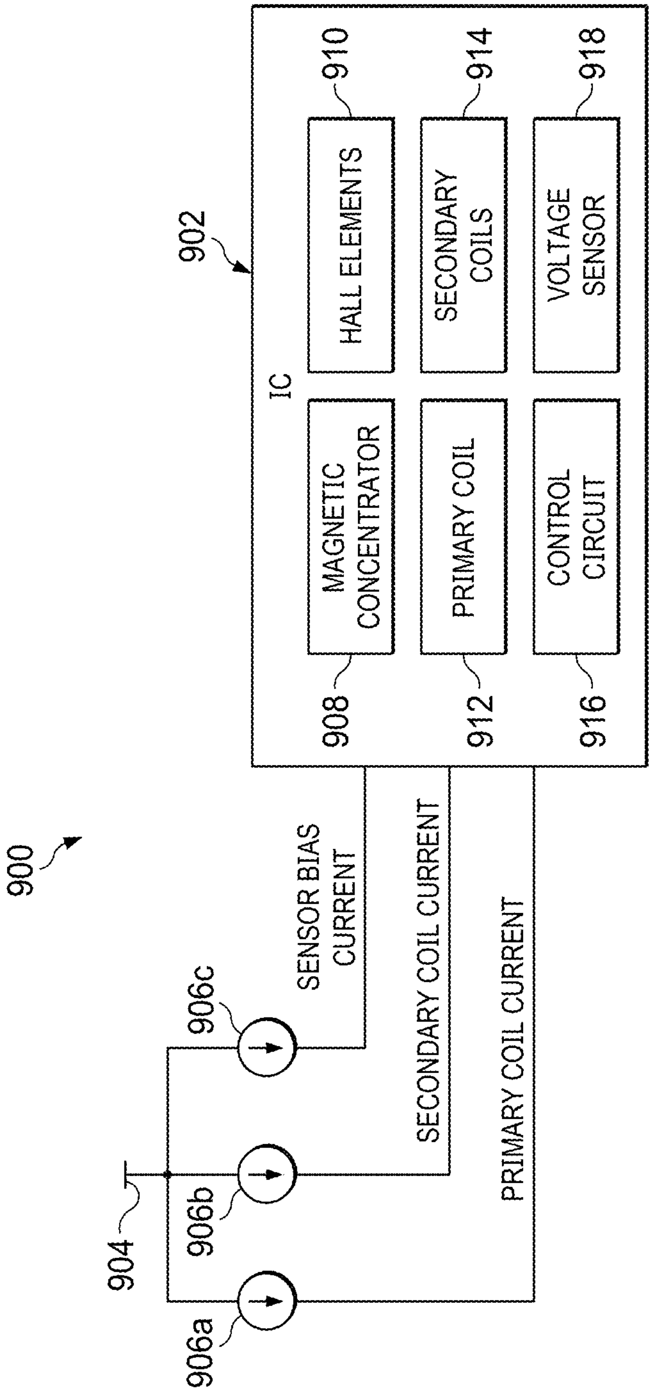
FIG. 9 is a Hall effect sensor system with complementary on-chip coils.

FIG. 9 is a Hall effect sensor system 900 with complementary on-chip coils. The Hall effect sensor system 900 includes an IC 902, a voltage source 904, a first current source 906*a*, a second current source 906*b*, and a third current source 906*c*. The IC 902 includes a magnetic concentrator 908, one or more Hall elements 910 such as multiple Hall elements 102 organized into one or more linear Hall element arrays 402, a primary coil 912, one or more secondary coils 914, a control circuit 916, and a voltage sensor 918.

The current sources 906 are each connected to the IC 902. The first current source 906*a* provides current to the primary coil 912, the second current source 906*b* provides current to the secondary coils 914, and the third current source 906*c* provides bias current to the Hall elements 910. The voltage sensor 918 senses sense voltages provided by the Hall elements 910 responsive to sensed magnetic fields (see FIG. 1). The control circuit 916 controls provision of respective currents to the primary coil 912, the secondary coil 914, and the Hall elements 910. In some examples, the control circuit 916 controls levels of current provided. In some examples, each of the current sources 906 provides as different current. In some examples, the control circuit 916 controls a functionality of the IC 902, such as a switching functionality, responsive to an output of the voltage sensor 918.

Figure 10A:
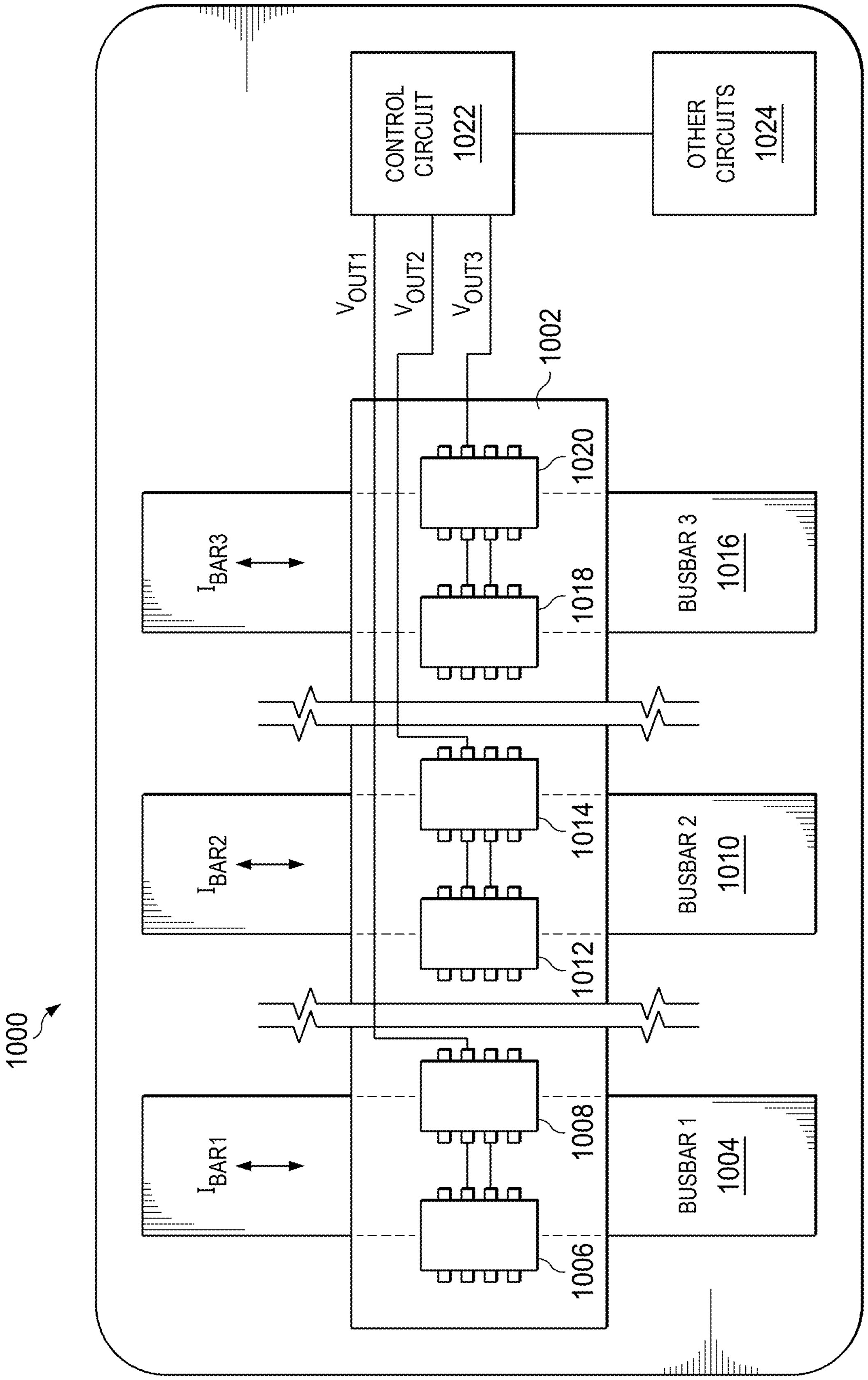
FIG. 10A is a functional block diagram of a first example sensed current system that includes the Hall effect sensor system of FIG. 4.

FIG. 10A is a functional block diagram of a first example sensed current system 1000 that includes the Hall effect sensor system 400 of FIG. 4. In particular, the sensed current system 1000 is an example of unshielded ambient current sensing. The sensed current system 1000 includes a printed circuit board (PCB) 1002, a first busbar (busbar 1) 1004, a first IC package 1006, a second IC package 1008, a second busbar (busbar 2) 1010, a third IC package 1012, a fourth IC package 1014, a third busbar (busbar 3) 1016, a fifth IC package 1018, a sixth IC package 1020, a control circuit 1022, and other circuits 1024. In some examples, other circuits 1024 correspond to circuits of a motor drive, a traction inverter, or other automotive (or other motor vehicle) or industrial application. Each of the IC packages 1006, 1008, 1012, 1014, 1018, and 1020 includes an IC that includes a Hall effect sensor system 400. In some examples, these ICs include circuits that convert a sensed magnetic field strength into a corresponding current level.

Each of the busbars 1004, 1010, and 1016 includes a first edge and a second edge opposite to the first edge. These first and second edges are located transverse to a direction of current flow of the respective busbar 1004, 1010, or 1016. The first, second, third, fourth, fifth, and sixth IC packages 1006, 1008, 1012, 1014, 1018, and 1020 are each coupled to the PCB 1002. In some examples, the control circuit 1022 and/or the other circuits 1024 are connected to the PCB 1002.

Each of the IC packages 1006, 1008, 1012, 1014, 1018, and 1020 are located sufficiently near a respective busbar 1004, 1010, or 1016 to enable current sensing by the respective included Hall effect sensor system 400. The first IC package 1006 overlaps the first edge of the first busbar 1004 and the second IC package 1008 overlaps the second edge of the first busbar 1004. The third IC package 1012 overlaps the first edge of the second busbar 1010 and the fourth IC package 1014 overlaps the second edge of the second busbar 1010. The fifth IC package 1018 overlaps the first edge of the third busbar 1016 and the sixth IC package 1020 overlaps the second edge of the third busbar 1016.

In some examples, connections among the IC packages 1006, 1008, 1012, 1014, 1018, and 1020 and/or the control circuit 1022 or other circuits 1024 correspond to traces of the PCB 1002. The first IC package 1006 is connected to the second IC package 1008. The third IC package 1012 is connected to the fourth IC package 1014. The fifth IC package 1018 is connected to the sixth IC package 1020. And the second IC package 1008, the fourth IC package 1014, and the sixth IC package 1020 are connected to the control circuit 1022 and respectively provide output voltages $V_{OUT1}$, $V_{OUT2}$, and $V_{OUT3}$. $V_{OUT1}$, $V_{OUT2}$, and $V_{OUT3}$ respectively indicate a current level or a magnetic field strength sensed by a corresponding pair of IC packages 1006 and 1008, or 1012 and 1014, or 1018 and 1020. In some examples, measuring magnetic field strength at the first and second edge of each busbar 1004, 1010, and 1016 enables cross talk between magnetic fields corresponding to different busbars 1004, 1010, and 1016 to be canceled.

The control circuit 1022 is connected to the other circuits 1024. The control circuit 1022 controls the other circuits 1024 responsive to $V_{OUT1}$, $V_{OUT2}$, and $V_{OUT3}$, accordingly, responsive to a current level of a corresponding busbar 1004, 1010, or 1016 indicated by a sensed magnetic field strength.

Figure 10B:
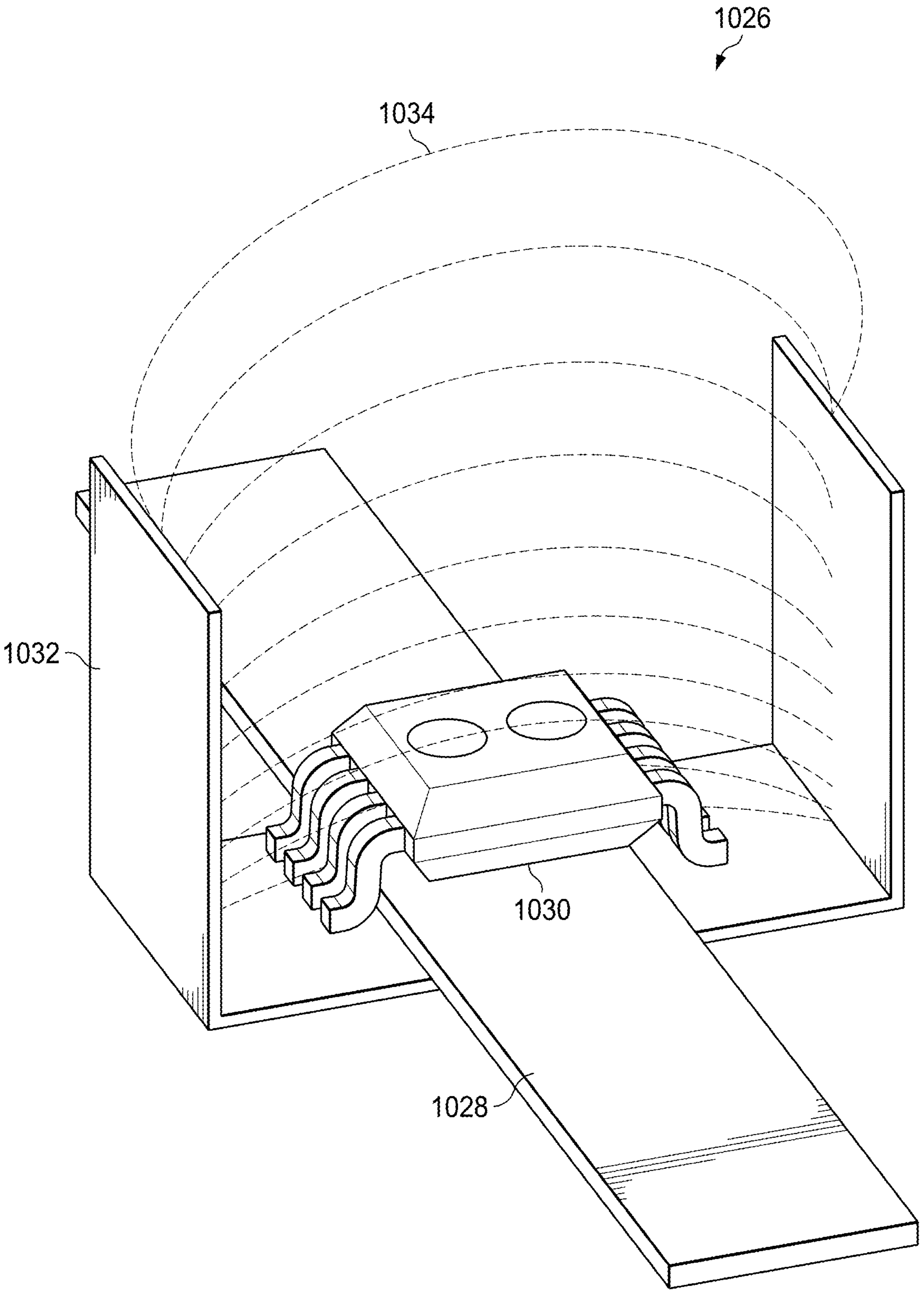
FIG. 10B is a functional block diagram of a second example sensed current system that includes the Hall effect sensor system of FIG. 4.

FIG. 10B is a functional block diagram of a second example sensed current system 1026 that includes the Hall effect sensor system 400 of FIG. 4. In particular, the sensed current system is an example of shielded ambient current sensing. The sensed current system 1026 includes a busbar 1028, an IC package 1030 that includes an IC that includes a Hall effect sensor system 400, and an electromagnetic (EM) shield 1032 that surrounds the busbar 1028 and the IC package 1030 on three sides. While the busbar 1028 conducts current, the EM shield 1032 confines a local portion of the magnetic field generated responsive to the current through the busbar 1028. This increases a strength of the magnetic field as it intersects the IC package 1030, increasing effective sensitivity of the Hall effect sensor system 400.

Figure 10C:
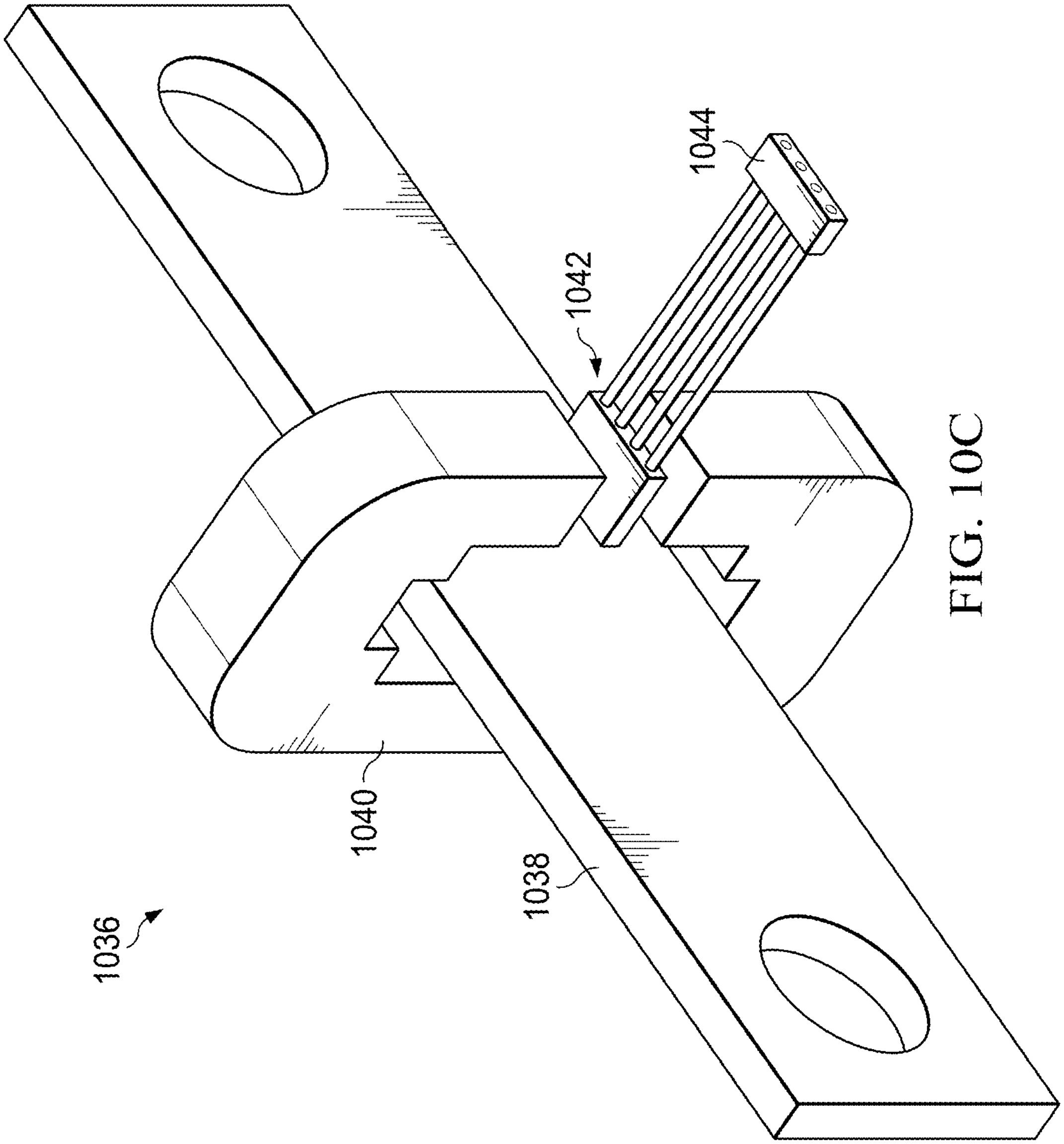
FIG. 10C is a functional block diagram of a third example sensed current system that includes the Hall effect sensor system of FIG. 4.

FIG. 10C is a functional block diagram of a third example sensed current system 1036 that includes the Hall effect sensor system 400 of FIG. 4. In particular, the sensed current system is an example of shielded ambient current sensing. The sensed current system 1036 includes a busbar 1038, an IC package 1040 that includes an IC that includes a Hall effect sensor system 400, a connector 1042 connected to the IC package 1040, and an electromagnetic (EM) shield 1044 that surrounds the busbar 1038 on four sides and the IC package 1040 on three sides. The connector 1042 enables the IC package 1040 to be connected to other circuits (see FIG. 10A) outside the IC package 1040, such as the control circuit 1022 and other circuits 1024.

Example relative positions, sizes, and/or spacing of components have been described herein. In some examples, different relative positions, sizes, and/or spacing of components can be used.

In some examples, process deviation in horizontal (X and Y) dimensions is relatively small. In some such examples, design focuses on tuning geometry to adjust correlation coefficients related to process deviation in a vertical (Z) dimension. In some examples, process deviation in the vertical dimension is relatively small, and design may focus on tuning geometry to adjust correlation coefficients related to process deviation in horizontal dimensions.

In some examples, the magnetic concentrator 404 has a different shape than described herein. In some examples, a magnetic concentrator 404 has a shape, viewed in a Z direction, of an octagon with different relative side lengths than shown, or a circle, square, ellipse, or rectangle. In some examples, primary and/or secondary coils 406 and/or 408 have a shape similar to the shape of the magnetic concentrator 404. In some examples, a circular or elliptical magnetic concentrator 404 corresponds to (respectively) a circular or elliptical primary coil 406 and/or circular or elliptical secondary coils 408.

In some examples, a linear Hall array 402 is centered (symmetrically positioned) within a surrounding secondary coil 408. In some examples, a linear Hall array 402 is not centered within the surrounding secondary coil 408.

In some examples, design of the primary coil 406 and secondary coils 408 is responsive to routing requirements for Hall sensor terminals, such as bias contacts 114 and sense contacts 116. Accordingly, in some examples, a complementary coil system including a primary coil 406 and one or more secondary coils 408 is restricted from using all metal layers in a region surrounding corresponding Hall elements 102.

In some examples, a linear array of Hall elements is not arranged as a straight line of Hall elements. In some examples, a linear array of Hall elements is arranged in a curved line of Hall elements, such as a smoothly curved line or monotonic curved line. In some examples, a linear array of Hall elements is arranged along an edge of a corresponding magnetic concentrator, and accordingly, an arrangement shape of the linear array of Hall elements conforms to the shape of that edge of that magnetic concentrator.

In some examples corresponding to a magnetic concentrator with a curved shape such as a circle or ellipse, or with a shape having a side overlapped by the linear array of Hall elements that is shorter than a length of the linear array of Hall elements, the linear array of Hall elements is similarly curved or includes an offset (or offsets) to correspond with the shape of the magnetic concentrator.

In some examples, different or additional size, location, and/or distance parameters are used to describe correlation coefficients. In some examples, such different or additional parameters are selected so that corresponding correlation coefficients reach an overall correlation coefficient of a corresponding Hall effect sensor system of 1:1, within a designed level of error. In some examples, such different or additional parameters include size, number, and/or spacing of Hall elements 102, shape of the linear Hall array 402, number and/or width of turns in a primary or secondary coil 406 or 408, shape of the magnetic concentrator 404 and dimensions of its sides (or focus locations, curvature, or similar), and horizontal positions of the linear Hall array 402 with respect to the magnetic concentrator 404 and/or the primary and/or secondary coil 406 and/or 408.

In some examples, components of the Hall effect sensor system 400 have different relative sizes and/or positions than described herein. In some examples, structural parameters of the Hall effect sensor system 400 such as sizes or relative positions or distances have different relative or proportional values than indicated by the figures.

In some examples, a correlation coefficient corresponding to a measure other than the Z2 distance 510 variation, or a selected correlation coefficient value, is used as a reference to which other correlation coefficients are adjusted.

In some examples, current flows in a same direction, such as clockwise or counterclockwise, through the secondary coils 408. In some examples, current flows in a different direction through the first secondary coil 408*a* with respect to the second secondary coil 408*b*.

In some examples, an axis other than a long axis of one or more of the magnetic concentrator 404, the primary coil 406, or a secondary coil 408 is aligned with, such as parallel to, a long axis of a linear array of Hall elements 402.

A busbar or cable is referred to herein as a high-current conductor. In some examples, a cable is used instead of a busbar in a sensed current system such as the sensed current system 1000 of FIG. 10A, or the sensed current system 1026 of FIG. 10B, or the sensed current system 1036 of FIG. 10C.

In some examples, a high-current conductor is a conductor configured to conduct more current than can be routed through an IC or an IC without risk of damage to the IC or IC package. In some examples, a high-current conductor other than a busbar or cable is used in a sensed current system.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

In this description, the term "and/or" (when used in a form such as A, B and/or C) refers to any combination or subset of A, B, C, such as: (a) A alone; (b) B alone; (c) C alone; (d) A with B; (c) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component.

While certain elements of the described examples may be included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Modifications are possible in the described examples, and other examples are possible within the scope of the claims.

What is claimed is:

1. An integrated circuit (IC) written on a substrate that includes a substrate surface, the IC comprising:
- a magnetic concentrator;
- a Hall sensor that at least partially overlaps the magnetic concentrator;
- a primary coil that at least partially overlaps the magnetic concentrator; and
- a secondary coil that at least partially overlaps the magnetic concentrator and the primary coil, and that surrounds the Hall sensor.

2. The IC of claim 1, wherein the primary coil overlaps the Hall sensor or the secondary coil does not overlap the Hall sensor.

3. The IC of claim 1, wherein the magnetic concentrator has an octagonal, elliptical, rectangular, or circular shape.

4. The IC of claim 1, wherein the primary and secondary coils respectively have rectangular shapes.

5. The IC of claim 1, wherein the IC includes at least one linear array of Hall sensors.

6. The IC of claim 5, wherein a shape of the linear array of Hall sensors conforms to a shape of an edge of the magnetic concentrator.

7. The IC of claim 1, wherein the secondary coil surrounds at least a portion of an edge of the magnetic concentrator and at least a portion of a side of the primary coil.

8. The IC of claim 1,
- wherein a first dimension of the magnetic concentrator is longer than a first dimension of the primary coil; and
- wherein a second dimension of the magnetic concentrator is longer than a second dimension of the primary coil.

9. The IC of claim 1, wherein the primary coil has multiple sides, and the magnetic concentrator at least partially overlaps each of the sides of the primary coil.

10. An integrated circuit (IC) written on a substrate that includes a substrate surface, the IC comprising:
- a magnetic concentrator;
- a Hall sensor that at least partially overlaps the magnetic concentrator;
- a primary coil that at least partially overlaps the magnetic concentrator, the primary coil located at a distance from the Hall sensor in a direction perpendicular to the substrate surface so that a response curve of the Hall sensor responsive to a distance between the primary coil and the magnetic concentrator balances a response curve of the Hall sensor responsive to a distance between the primary coil and the Hall sensor; and
- a secondary coil that at least partially overlaps the magnetic concentrator and the primary coil, and that surrounds the Hall sensor.

11. The IC of claim 10, wherein the magnetic concentrator has a long axis and a short axis perpendicular to its long axis, and the primary coil has a long axis aligned with the long axis of the magnetic concentrator and a short axis aligned with the short axis of the magnetic concentrator.

12. The IC of claim 11, wherein the magnetic concentrator has a long edge aligned with its long axis, and the Hall sensor overlaps the long edge of the magnetic concentrator.

13. The IC of claim 11, wherein an inner distance of the primary coil in a direction of its long axis and an inner distance of the primary coil in a direction of its short axis are such that a correlation coefficient corresponding to misalignment of the magnetic concentrator in a direction of its short axis equals a correlation coefficient corresponding to a distance between the Hall sensor and the magnetic concentrator.

14. The IC of claim 10, wherein a thickness of the magnetic concentrator in a direction perpendicular to the substrate surface is such that a correlation coefficient corresponding to the thickness of the magnetic concentrator equals a correlation coefficient corresponding to a distance between the Hall sensor and the magnetic concentrator.

15. The IC of claim 10, wherein the primary coil overlaps the Hall sensor or the secondary coil does not overlap the Hall sensor.

16. A system comprising:
- a high-current conductor; and
- an integrated circuit (IC) written on a substrate that includes a substrate surface, the IC including:
  - a magnetic concentrator;
  - a Hall sensor that at least partially overlaps the magnetic concentrator;
  - a primary coil that at least partially overlaps the magnetic concentrator; and
  - a secondary coil that at least partially overlaps the magnetic concentrator and the primary coil, and that surrounds the Hall sensor.

17. The system of claim 16, further comprising an electromagnetic shield that surrounds the high-current conductor and the IC on three sides.

18. The system of claim 16, wherein the high-current conductor is a busbar or cable.

19. The system of claim 16, wherein the IC is a first IC, the system further comprising:

a second IC;

a printed circuit board (PCB), the first IC and the second IC coupled to the PCB, the first IC overlapping a first edge of the high-current conductor, and the second IC overlapping a second edge of the high-current conductor.

20. The system of claim 16, wherein the primary coil overlaps the Hall sensor or the secondary coil does not overlap the Hall sensor.

* * * * *